US012567292B2

(12) United States Patent (10) Patent No.: US 12,567,292 B2
Aneja et al. (45) Date of Patent: Mar. 3, 2026

(54) AUTOMOTIVE FAULT DETECTION SYSTEMS AND METHODS

(71) Applicant: QUALCOMM INCORPORATED, San Diego, CA (US)

(72) Inventors: Amit Aneja, Chandler, AZ (US); Rahul Gulati, San Diego, CA (US); Sriram Hariharan, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 433 days.

(21) Appl. No.: 18/176,902

(22) Filed: Mar. 1, 2023

(65) Prior Publication Data

US 2024/0296702 A1 Sep. 5, 2024

(51) Int. Cl.
*G07C 5/08* (2006.01)
*B60R 16/023* (2006.01)
*B60W 50/02* (2012.01)
*G01R 31/00* (2006.01)

(52) U.S. Cl.
CPC ......... *G07C 5/0808* (2013.01); *G01R 31/007* (2013.01); *B60R 16/023* (2013.01); *B60W 50/0225* (2013.01)

(58) Field of Classification Search
CPC .. G07C 5/0808; G01R 31/007; B60R 16/023; B60W 50/0225; G06F 11/0751; G06F 11/2025; G06F 11/2035; G06F 11/165; G06F 11/1637
See application file for complete search history.

(56) References Cited

U.S. PATENT DOCUMENTS

| 5,422,915 | A | * | 6/1995 | Byers | ................. G06F 11/1604 327/295 |
| 9,236,864 | B1 | * | 1/2016 | Loh | ..................... G11C 29/702 |
| 11,449,396 | B2 | | 9/2022 | Cormack et al. | |

(Continued)

FOREIGN PATENT DOCUMENTS

| EP | 3869338 A1 | 8/2021 |
| WO | 2022268270 A1 | 12/2022 |

OTHER PUBLICATIONS

Partial International Search Report—PCT/US2024/014392—ISA/ EPO—Jun. 14, 2024.

(Continued)

*Primary Examiner* — Bryce P Bonzo
*Assistant Examiner* — Xinyuan Yu
(74) *Attorney, Agent, or Firm* — Smith Tempel Blaha LLC

(57) ABSTRACT

Fail-safe and Fail-operational behavior can be achieved by providing two fully-redundant execution channels comprising at least first and second chiplet dies on a single SoC that are in communication with one another via a D2D interface. At least first and second instances of a first automotive safety integrity level (ASIL) domain circuit disposed on the at least first and second chiplet dies, respectively, perform at least a first ASIL domain process on one or more automotive sensor output signals to produce first and second output signals, respectively. A fault monitoring system monitors at least the first chiplet die for faults and assigns a first value to a selector signal if it detects a fault in the first chiplet die. A selector circuit outputs the second output signal from the system if the selector signal has the first value.

30 Claims, 9 Drawing Sheets

(56) References Cited

U.S. PATENT DOCUMENTS

| | | | | |
|---|---|---|---|---|
| 2014/0351658 A1 | 11/2014 | D'Ambrosio | | |
| 2018/0370540 A1 | 12/2018 | Yousuf et al. | | |
| 2019/0340116 A1 | 11/2019 | Miyauchi | | |
| 2020/0026598 A1* | 1/2020 | Boschi | ............... | G06F 11/0784 |
| 2020/0039530 A1 | 2/2020 | Smolyansky et al. | | |
| 2020/0278897 A1 | 9/2020 | Cormack et al. | | |
| 2021/0305927 A1* | 9/2021 | Kirby | ................. | H02P 29/0241 |
| 2022/0080992 A1 | 3/2022 | Yousuf | | |
| 2022/0109445 A1* | 4/2022 | Rao | .................... | H03K 3/35625 |
| 2022/0121512 A1 | 4/2022 | Srivastava et al. | | |
| 2022/0144224 A1* | 5/2022 | Tarandek | ................ | G05G 5/03 |
| 2022/0334936 A1* | 10/2022 | Srivastava | ............... | G06F 9/52 |

OTHER PUBLICATIONS

International Search Report and Written Opinion—PCT/US2024/014392—ISA/EPO—Sep. 27, 2024.

* cited by examiner

200

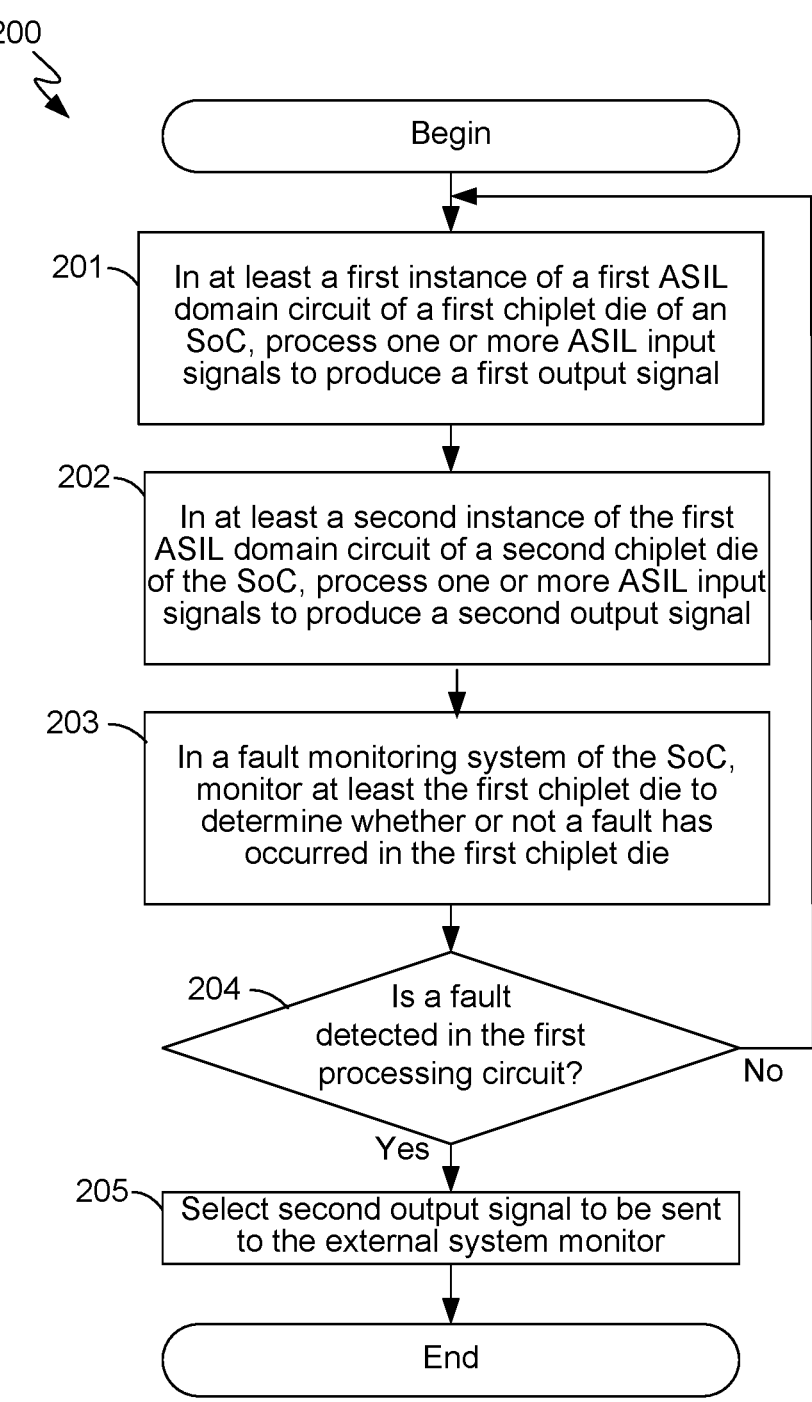

Begin

201 — In at least a first instance of a first ASIL domain circuit of a first chiplet die of an SoC, process one or more ASIL input signals to produce a first output signal 202 — In at least a second instance of the first ASIL domain circuit of a second chiplet die of the SoC, process one or more ASIL input signals to produce a second output signal 203 — In a fault monitoring system of the SoC, monitor at least the first chiplet die to determine whether or not a fault has occurred in the first chiplet die 204 — Is a fault detected in the first processing circuit?

No

Yes

205 — Select second output signal to be sent to the external system monitor

End

FIG. 2

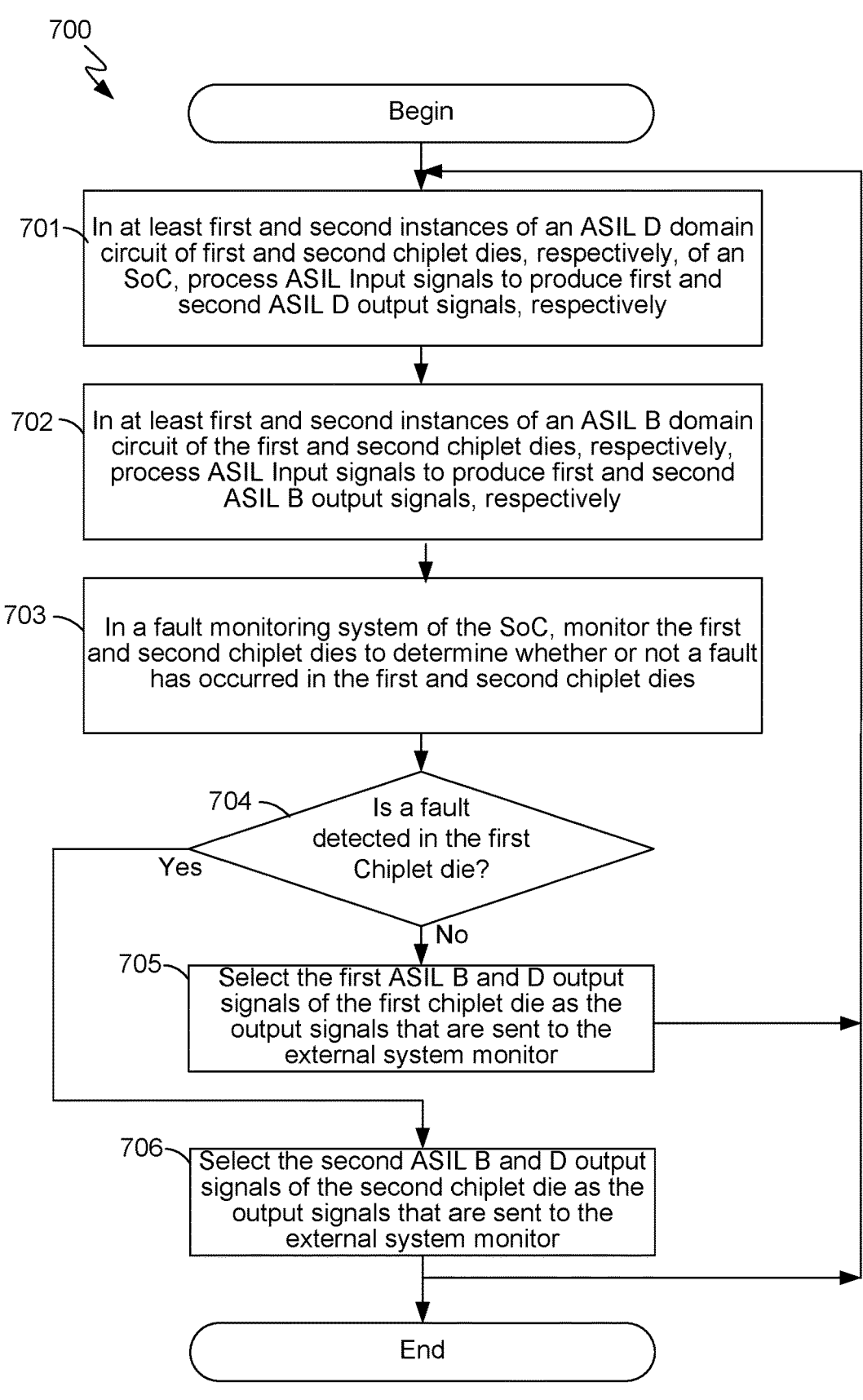

700

Begin

701 — In at least first and second instances of an ASIL D domain circuit of first and second chiplet dies, respectively, of an SoC, process ASIL Input signals to produce first and second ASIL D output signals, respectively 702 — In at least first and second instances of an ASIL B domain circuit of the first and second chiplet dies, respectively, process ASIL Input signals to produce first and second ASIL B output signals, respectively 703 — In a fault monitoring system of the SoC, monitor the first and second chiplet dies to determine whether or not a fault has occurred in the first and second chiplet dies 704 — Is a fault detected in the first Chiplet die?

Yes

No

705 — Select the first ASIL B and D output signals of the first chiplet die as the output signals that are sent to the external system monitor 706 — Select the second ASIL B and D output signals of the second chiplet die as the output signals that are sent to the external system monitor End

FIG. 7

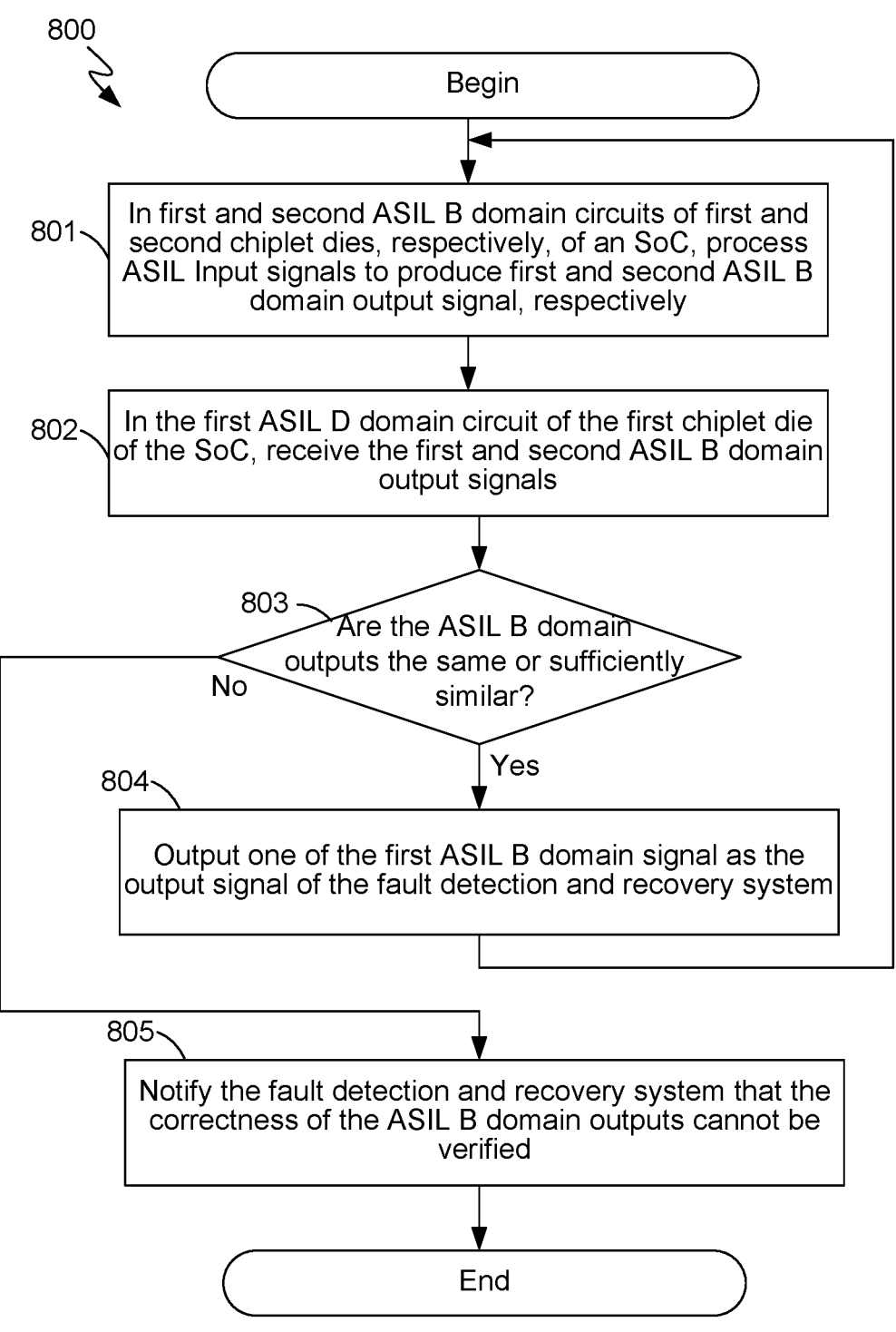

800

Begin

801 — In first and second ASIL B domain circuits of first and second chiplet dies, respectively, of an SoC, process ASIL Input signals to produce first and second ASIL B domain output signal, respectively 802 — In the first ASIL D domain circuit of the first chiplet die of the SoC, receive the first and second ASIL B domain output signals 803 — Are the ASIL B domain outputs the same or sufficiently similar?

No

Yes

804 — Output one of the first ASIL B domain signal as the output signal of the fault detection and recovery system 805 — Notify the fault detection and recovery system that the correctness of the ASIL B domain outputs cannot be verified End

FIG. 8

900
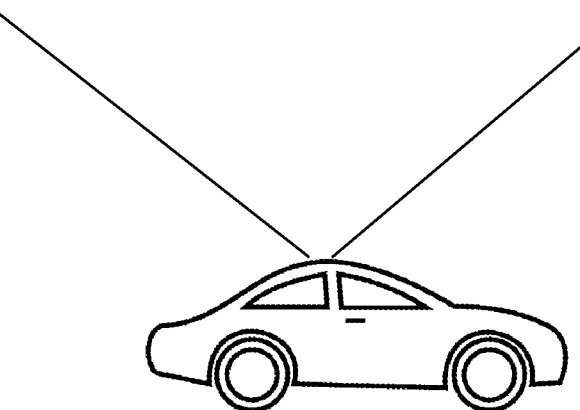
Any Of Systems 100, 300, 400 Or 500 Performing Any Of Methods 200, 600, 700 or 800, Or Combinations Of Those Methods
FIG. 9

AUTOMOTIVE FAULT DETECTION SYSTEMS AND METHODS

DESCRIPTION OF THE RELATED ART

Computing devices and their components may experience operational failures, possibly leading to undesirable outcomes. In some types of computing devices, such as safety-critical systems used in vehicle automated driving systems, an unexpected failure may lead to conditions dangerous to drivers and others. One of the key underpinnings of an automated driving system, especially for level 3 (L3) and higher levels of autonomy as defined by the Society of Automotive Engineers (SAE) in SAE J3016, is its ability to continue to stay operational while electrical/electronic (E/E) faults or other failures in software have been detected by the Advanced Driver Assistance System (ADAS) or automated driving system (ADS). The electronic control unit (ECU) is the heart of ADAS/ADS systems and fuses together large amounts of information about the surrounding environment acquired from various sensors, such as stereo cameras, radar, and other sensors to perform a complex and computationally intense problem that is critical to ensuring the availability of the system while continuously detecting and managing faults during mission mode.

Different manufacturers are approaching this problem differently depending on the Operational Design Domain (ODD) they want to achieve with their automated driving vehicles and the cost trade-offs for developing such systems. There are generally two different types of automotive safety systems, namely, Fail-safe systems and Fail-operational system. At a high level, a Fail-safe system, upon detection of faults, places the automated driving system in a state such that an overall safe state (as defined by vehicle manufacturer's safety policy) is achieved. A simple example of a Fail-safe system is one that safely shuts down after detecting a fault and informs the driver that they should not rely on the driver assist features of the vehicle. In Fail-operational systems, at a high level, upon detection of faults, the system is put into a state such that the overall continued operation of the system is maintained. Depending on the level of autonomy, driver intervention may be required, but the system should be able to continue to provide some automated driving functions.

A need exists for systems and methods that are better at maintaining the operational safety level for which they have been designed while continuously monitoring and managing faults.

SUMMARY OF THE DISCLOSURE

Systems, methods, and other examples are disclosed for automotive fault detection and recovery.

An exemplary system for automotive fault detection and recovery system comprises at least first and second chiplet dies disposed in a system-on-a-chip (SoC) integrated circuit (IC) package and being in communication with one another via a die-to-die interface. The first and second chiplet dies comprise at least first and second instances of a first automotive safety integrity level (ASIL) domain circuit, respectively. The first and second instances of the first ASIL domain circuit are configured to perform at least a first ASIL domain process on one or more ASIL input signals to produce first and second output signals, respectively, that are outputted from the first and second instances, respectively, of the first ASIL domain circuit. A selector circuit of the system is configured to select one of the first and second output signals based on a value assigned to a selector signal received by the selector circuit. A fault monitoring system of the system is configured to monitor the first and second chiplet dies and to assign a first value to the selector signal if the fault monitoring system detects a fault in the first chiplet die. Assignment of the first value to the selector signal causes the second output signal to be output from the automotive fault detection and recovery system.

An exemplary method for performing automotive fault detection and recovery comprises, in first and second instances of a first ASIL domain circuit of first and second chiplet dies, respectively, disposed in an SoC IC package, performing at least a first ASIL domain process on one or more ASIL input signals to produce first and second output signals, respectively, that are outputted from the first and second instances of the first ASIL domain circuit, respectively. The first and second chiplet dies are interfaced with one another via a die-to-die interface to enable the first and second chiplet dies to communicate with one another. The method further comprises, with a fault monitoring system, monitoring at least the first chiplet die for faults and assigning a first value to a selector signal if the fault monitoring system detects a fault in the first chiplet die. The method further comprises, with a selector circuit that receives the selector signal and the first and second output signals, outputting the second output signal from the automotive fault detection and recovery system if the selector signal has been assigned the first value.

An exemplary non-transitory computer-readable medium comprises computer instructions for execution by at least first and second chiplet dies disposed in an SoC IC package of an automotive fault detection and recovery system. The first and second chiplet dies are in communication with one another via a die-to-die interface. The computer instructions comprise first and second sets of computer instructions for execution by the first and second chiplet dies, respectively, to perform a first ASIL domain process on one or more ASIL input signals to produce first and second output signals, respectively, that are outputted from the first and second chiplet dies, respectively. The computer instructions further comprise a third set of computer instructions for causing a selector circuit to select one of the first and second output signals to be outputted from the automotive fault detection and recovery system based on a value assigned to a selector signal received by the selector circuit. The computer instructions further comprise a fourth set of computer instructions for monitoring the first and second chiplet dies for faults and for assigning a first value to the selector signal if the fault monitoring system detects a fault in the first chiplet die. Assignment of the first value to the selector signal causes the second output signal to be outputted from the automotive fault detection and recovery system by the selector circuit.

Another exemplary automotive fault detection and recovery system comprises at least first and second chiplet dies disposed in an SoC IC package and in communication with one another via a die-to-die interface. The first and second chiplet dies comprise at least a first and second means for performing at least a first ASIL domain process on one or more ASIL input signals to produce first and second output signals, respectively. The system further comprises means for selecting one of the first and second output signals to be outputted from the automotive fault detection and recovery system based on a value assigned to a selector signal received by the means for selecting. The system further comprises means for monitoring the first and second chiplet dies and for assigning a first value to the selector signal if the means for monitoring detects a fault in the first chiplet die.

Assignment of the first value to the selector signal causes the second output signal to be outputted from the automotive fault detection and recovery system.

These and other features and advantages will become apparent from the following description, drawings and claims.

BRIEF DESCRIPTION OF THE DRAWINGS

In the Figures, like reference numerals refer to like parts throughout the various views unless otherwise indicated. For reference numerals with letter character designations such as "101$a$" or "101$b$", the letter character designations may differentiate two like parts or elements present in the same Figure. Letter character designations for reference numerals may be omitted when it is intended that a reference numeral to encompass all parts having the same reference numeral in all Figures.

FIG. 2 is a flow diagram of the automotive fault monitoring and recovery method in accordance with an exemplary embodiment.

FIG. 7 is a flow diagram of the automotive fault monitoring and recovery method in accordance with an exemplary embodiment in which the first and second chiplet dies each comprise an ASIL B domain circuit and an ASIL D domain circuit, as depicted in FIGS. 4 and 5, and the primary channel comprises the first chiplet die.

FIG. 8 is a flow diagram of the automotive fault monitoring and recovery method in accordance with an exemplary embodiment in which ASIL decomposition is performed by comparing the outputs of first and second ASIL B domain circuits of the first and second chiplet dies, respectively, and using the comparison results to evaluate the overall correctness of the output of the fault detection and recovery system.

FIG. 9 is a pictorial image of a vehicle in which any of the systems shown in FIGS. 1, 3, 4 and 5 performing any of the methods shown in FIG. 2, 6, 7 or 8, or combinations thereof, is incorporated as part of an ADAS/ADS system of the vehicle.

DETAILED DESCRIPTION

In accordance with inventive principles and concepts of the present disclosure, a fault detection and recovery system achieves Fail-safe and Fail-operational behavior by providing at least two fully-redundant execution channels comprising at least first and second chiplet dies on a single system-on-a-chip (SoC) integrated circuit package. The chiplet dies are in communication with one another via a die-to-die interface. At least first and second instances of a first automotive safety integrity level (ASIL) domain circuit disposed on the first and second chiplet dies, respectively, perform at least a first ASIL domain process on one or more ASIL input signals (e.g., automotive sensor output signals) to produce first and second output signals, respectively, for use by an external system monitor. A fault monitoring system monitors at least the first chiplet die for faults and assigns a first value to a selector signal if it detects a fault in the first chiplet die. A selector circuit outputs the second output signal to the external system monitor if the selector signal has the first value.

The word "exemplary" is used herein to mean "serving as an example, instance, or illustration." The word "representative" may be used herein synonymously with the word "exemplary." Any aspect described herein as "exemplary" is not necessarily to be construed as preferred or advantageous over other aspects.

The term "ASIL Input Signals" is used herein to mean any signals that are processed by ASIL domain circuits, including, but not limited to, automotive sensor output signals, such as camera, Lidar and Radar output signals, for example. The term "ASIL input signals" can also means signals that are read from memory to be processed by the ASIL domain circuit to generate some type of ASIL domain output signal. For example, a data signal can be read from nonvolatile memory and processed by an ASIL domain circuit to produce a high definition (HD) map as the output of the ASIL domain circuit. An "ASIL domain process," as that term is used herein, can mean a process that processes one or more automotive sensor output signals to produce one or more ASIL domain output signals, as well as a process that processes other types of ASIL domain circuit inputs, such as processes that process data read from memory or data sent to the ASIL domain circuit from some source other than an automotive sensor.

Figure 1:
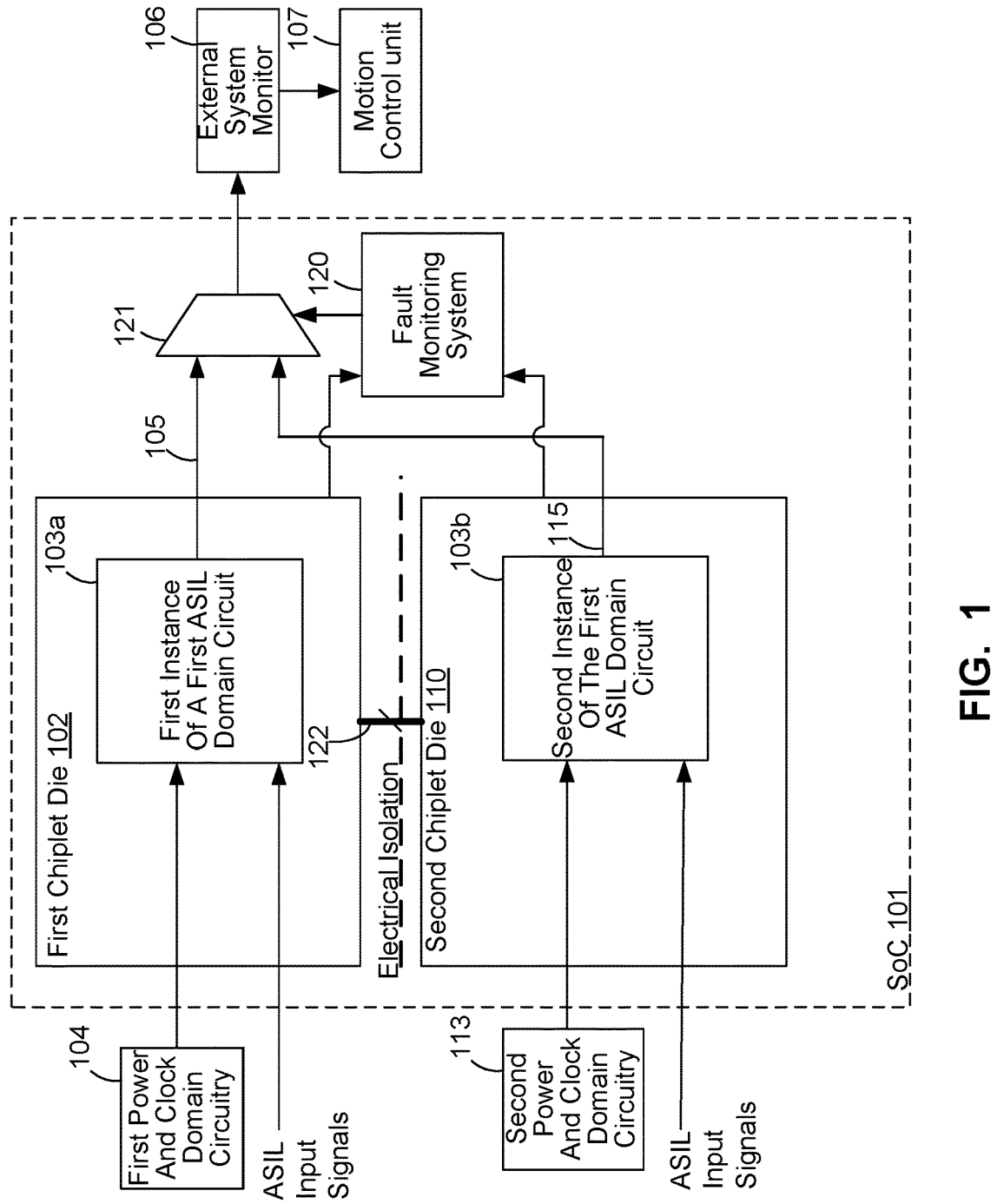
FIG. 1 is a block diagram of an automotive fault detection and recovery system in accordance with an embodiment that achieves at least one of Fail-safe behavior and Fail-operational behavior, depending on the manner in which the system is designed and implemented.

FIG. 1 is a block diagram of an automotive fault detection and recovery system 100 in accordance with an embodiment that achieves at least one of Fail-safe behavior and Fail-operational behavior, depending on the manner in which the system 100 is designed and implemented. An SoC 101 of the system 100 comprises first and second chiplet dies 102 and 110, respectively, that are in communication with one another via a die-to-die interface 122. The first chiplet die 102 comprises at least a first automotive safety integrity level (ASIL) domain circuit 103$a$ that is configured to perform a first ASIL algorithm or process. The first chiplet die 102 preferably operates in a first clock and power domain defined by a first clock signal and a first supply voltage generated by first clock and power domain circuitry 104. The first clock signal operates at a first clock frequency.

The first ASIL domain circuit 103$a$ receives ASIL input signals (e.g., sensor output signals from one or more vehicle sensors indicative of conditions sensed by the vehicle sensor (s), HD map data signals, etc.) and performs the first ASIL domain process that processes the ASIL input signals to produce an output signal 105 that can be used by an external system monitor 106, which is typically implemented using one or more microcontrollers that further check and verify the signal 105 or propagate it as-is to another ECU that can use the signal 105 to control vehicle motion. The external system monitor 106, which may or may not be implemented on the same ECU/box as the SoC 101, can locally decide how to manage faults/errors received from chiplet dies 102 and 110 or from the SoC 101. The error outputs from the external system monitor 106 can be propagated to other ECUs, such as a vehicle motion control unit (MCU) 107, as necessary over a vehicle bus to cause the vehicle to perform Fail-safe or Fail-operational behavior, depending on how the system 100 is designed and implemented. It should be noted that in some embodiments the MCU 107 can be directly connected to the output of the selector circuit 121.

The first ASIL domain circuit 103*a* and the first clock and power domain circuitry 104 correspond to the first redundant execution channel of the system 100, although additional elements or components that are not shown in FIG. 1 may be included in the first redundant execution channel, either internal or external to the first chiplet die 102.

The first power and clock domain circuitry 104 is typically external to the SoC 101 and typically comprises a power management IC (PMIC) and clock generation circuitry (i.e., a crystal and associated circuitry), respectively. Alternatively, the circuitry 104 could comprise one or more other chiplet dies of the SoC 101 or one or more IP blocks of the SoC 101. For example, the first power and clock domain circuitry 104 may comprise a separate PMIC that is integrated onto a separate chiplet die of the SoC 101 that is in communication with the first chiplet die 102 via a D2D interface. Likewise, the first power and clock domain circuitry 104 may comprise a separate clock generation chiplet die of the SoC 101 with its own oscillator that generates the first clock signal and that is in communication with the first chiplet die 102 via a D2D interface.

The ASIL domain circuit 103*a* can have a variety of configurations that will depend in large part on the safety behavior that the vehicle manufacturer designs the vehicle to have. The International Organization For Standardization (ISO) 26262 standard defines four ASILs, namely ASIL A-ASIL D, that establish safety requirements that electrical/electronic (EE) automotive components must meet in order to be compliant with the standard. The levels are based on probability of occurrence, severity of harm, and likelihood of controllability if the EE automotive component fails. ASILs A and D represent the lowest and highest degrees of rigor, respectively, applied to safety assurance. For example, components used in airbag systems, anti-lock brake systems, and power steering systems require an ASIL D grade due to the high risk of harm associated with their failure, whereas components used in satellite/digital radio systems and navigation systems require only an ASIL A grade due to the low risk of harm associated with failure. Head lights and brake lights generally would require an ASIL B grade while cruise control would require an ASIL C grade.

The ASIL domain that is monitored and controlled by the first ASIL domain circuit 103*a* can be an ASIL A, B, C or D domain circuit. Most Fail-safe and Fail-operational behavior falls into the ASIL B and D domains, and therefore the first ASIL domain circuit 103*a* will typically be configured to perform operations associated with achieving ASIL B and/or D performance, as will be described below in more detail.

A second chiplet die 110 of the SoC 101 comprises at least a second instance 103*b* of the first ASIL domain circuit 103*a*, which preferably is operating in a second clock and power domain generated by second clock and power domain circuitry 113 that is independent of the first power and clock domain generated by the first power and clock domain circuitry 104. The second clock and power domain circuitry 113 generates a second supply voltage and a second clock signal that are provided to the second instance 103*b* of the first ASIL domain circuit 103*a*. The second clock signal operates at a second clock frequency. The first and second clock frequencies can be the same, but are independently generated. Likewise, the first and second supply voltages can be the same, but are independently generated. Therefore, a fault in or failure of the first power and clock domain circuitry 104 will not impact the second clock and power domain circuitry 113, and vice versa.

The second power and clock domain circuitry 113 is typically external to the SoC 101 and typically comprises a PMIC and clock generation circuitry, respectively. Alternatively, the circuitry 113 could comprise one or more other chiplet dies of the SoC 101 or one or more IP blocks of the SoC 101.

The terms "first instance" and "second instance," as used herein, mean that the ASIL domain circuits 103*a* and 103*b* are identically configured or nearly identically configured such that they perform identical or nearly identical algorithms. In some cases, the configurations may intentionally be made to be slightly different so that a defect in the design of one will not necessarily be duplicated in the other. This type of intentional difference in the configurations is often used with redundant circuits and is sometimes referred to as diversity of implementation. Despite this difference, if the circuits 103*a* and 103*b* receive the same input, they will produce the same output due to their identical or nearly identical configurations in the absence of a fault occurring. In other words, in the absence of a fault, they perform the same or equivalent operations, although possibly in different ways, to achieve the same result.

The second instance of the first ASIL domain circuit 103*b* receives ASIL input signals (e.g., vehicle sensor output signals indicative of conditions sensed by the vehicle sensor (s)) and performs the first ASIL domain process or algorithm that processes the ASIL input signals to produce an output signal 115 that is received and processed by the external system monitor 106 and possibly by other downstream circuitry, as discussed above, to cause the vehicle to perform Fail-safe or Fail-operational operations depending on implementation.

The second instance of the first ASIL domain circuit 103*b* and the second clock and power domain circuitry 113 correspond to the second redundant execution channel of the system 100, although additional elements or components that are not shown may be included in the second redundant execution channel, either internal or external to the second chiplet die 110.

As will be described below in more detail, the sensor output signals that are received by the first and second instances of the first ASIL domain circuits 103*a* and 103*b*, respectively, can be output signals from the same set of sensors or from different sets of sensors depending on the manner in which the system 100 is implemented and the ASIL goals that the system 100 is intended to achieve, as will be described below in more detail.

A fault monitoring system 120 of the system 100 monitors the first and second redundant execution channels for faults or failures that can affect Fail-safe and/or Fail-operational behavior, depending the type of behavior the system 100 is designed and configured to achieve. If the fault monitoring system 120 detects an EE or software fault or failure in the first redundant execution channel, it causes a selector circuit 121 to select the output signal 115 to be input to the external system monitor 106.

As will be described below in more detail, in some embodiments the first channel can act as a backup channel for the second channel such that if the fault monitoring system 120 detects a fault or failure in the second redundant execution channel, it causes the selector circuit 121 to select the output signal 105 to be input to the external system monitor 106, which then causes the appropriate action to be taken to achieve Fail-safe or Fail-operational behavior.

It should be noted that although the fault monitoring system 120 is shown as being external to the first and second chiplet dies 102 and 110, respectively, it can be instantiated in one or both of the dies 102 and 110. In addition, in embodiments in which the fault monitoring system 120 is instantiated in one or both of the chiplet dies 102 and 110, the system 100 can include an additional external fault monitoring circuit to provide additional fault monitoring redundancy. In embodiments in which the fault monitoring system 120 is instantiated in both of the chiplet dies 102 and 110, the fault monitoring circuits can be in communication with one another so that the circuits can make one another aware of any fault that is detected in either of the chiplet dies 102 and 110.

Although the first and second chiplet dies 102 and 110, respectively, are in communication with one another via the D2D interface 122, they preferably are electrically isolated from one another. The term "electrically isolated," as used in the present disclosure, means that the chiplet dies 102 and 110 operate on different power supply rails or different PMICs and that power level errors impacting the ASIL domain circuit(s) of one of the dies 102, 110 may not impact the ASIL domain circuit(s) of the other die and therefore allow the ASIL domain circuits to continue to operate in degraded mode of operation and have higher availability for redundancy. In addition, this may mean, for example, that a power level, power surge or related errors in the first chiplet die 102 is prevented from cascading to the second chiplet die 110, and vice versa.

The electrical isolation and the separate power and clock domain circuits 104, 113 better ensure ASIL execution redundancy by preventing an EE fault or failure on the first chiplet die 102 from causing an EE fault or failure on the second chiplet die 110, and vice versa. Control signals and/or data can be exchanged between the chiplet dies 102 and 110 via the D2D interface 122. The D2D interface 122 can be any suitable interface for interfacing chiplet dies with one another. A number of D2D interfaces that are suitable for this purpose are currently available in the market.

It should be noted that the SoC 101 can include a variety of additional components that are not shown in FIG. 1.

FIG. 2 is a flow diagram of the automotive fault monitoring and recovery method 200 in accordance with an exemplary embodiment. In at least a first instance of a first ASIL domain circuit of a first chiplet die of an SoC, ASIL input signals (e.g., one or more automotive sensor output signals) are processed in accordance with a first ASIL domain process or algorithm to produce a first output signal for use by an MCU of a vehicle to control motion of the vehicle, as indicated by block 201. In at least a second instance of the first ASIL domain circuit disposed on a second chiplet die of the first SoC, one or ASIL input signals (e.g., one or more automotive sensor output signals) are processed in accordance with the first ASIL domain process or algorithm to produce a second output signal for use by the MCU to control motion of the vehicle, as indicated by block 202.

In at least a first fault monitoring and detection system, at least the first chiplet die is monitored to determine whether or not a fault has occurred in the first chiplet die, as indicated by block 203. A determination is made at block 204 of whether or not a fault is detected. If it is determined at block 204 that no fault is detected in the first chiplet die, then the process returns to block 201 and repeats. If it is determined a block 204 that a fault is detected in the first chiplet die, then a selector signal is generated by the fault monitoring and detection system that causes the second output signal to be selected and sent to the MCU, as indicated by block 205. The process can then end or return to block 201 and repeat or start over.

Additional steps not shown in FIG. 2 may also take place, such as, for example, rebooting or resetting the first chiplet die after a fault has been detected, the fault monitoring system 120 causing the vehicle to perform a minimum risk maneuver (MRM) after a fault has been detected, the system 120 providing the driver with visual, haptic and/or sound-based alerts that a fault has been detected and that self-driving features are temporarily disabled, or the system causing some other Fail-operational or Fail-safe action to be performed after a fault has been detected.

Figure 3:
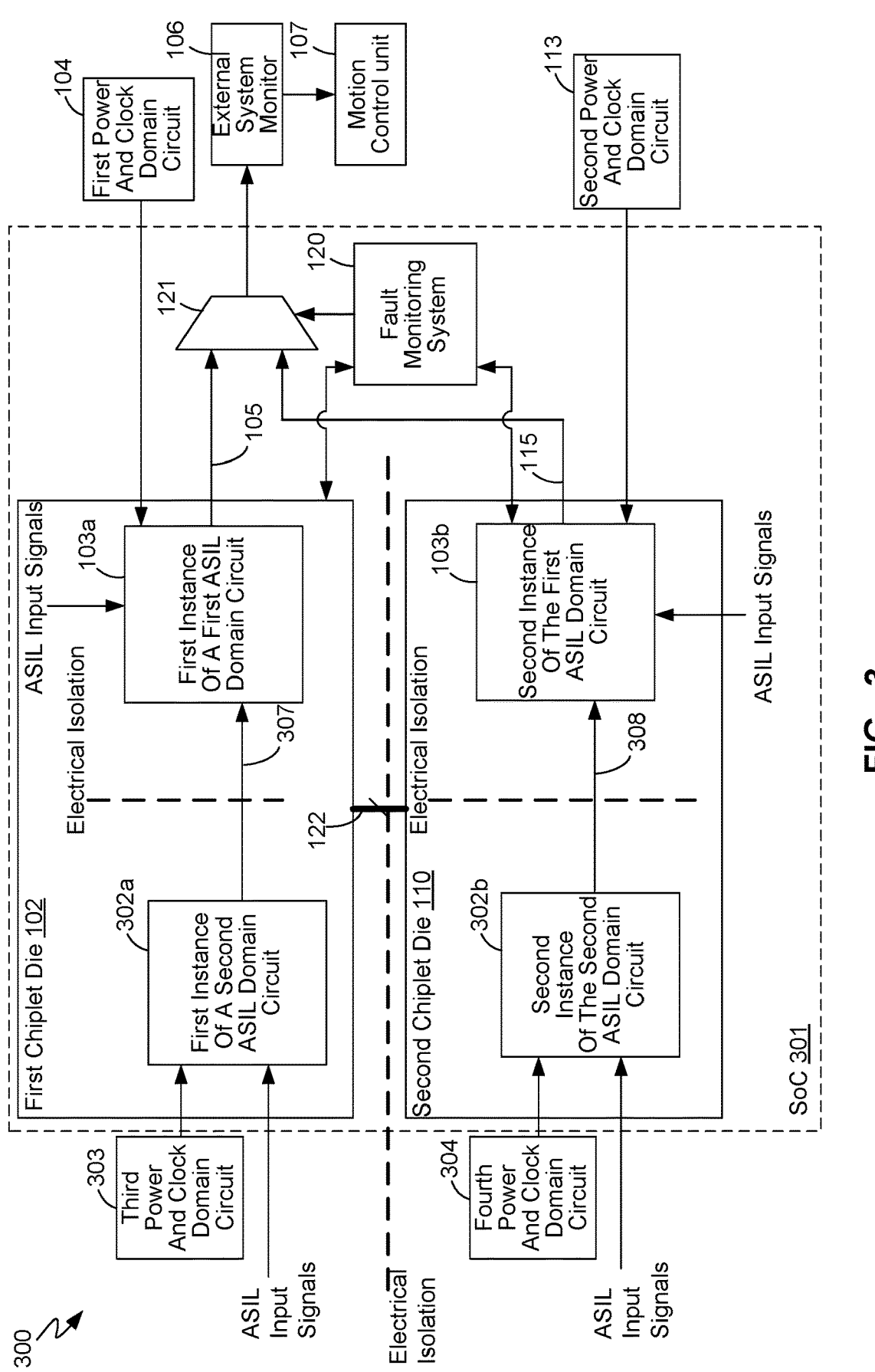
FIG. 3 is a block diagram of an automotive fault detection and recovery system in accordance with another exemplary embodiment that achieves at least one of Fail-safe behavior and Fail-operational behavior, depending on the manner in which the system is designed and implemented.

FIG. 3 is a block diagram of an automotive fault detection and recovery system 300 in accordance with another exemplary embodiment that achieves at least one of Fail-safe behavior and Fail-operational behavior, depending on the manner in which the system 300 is designed and implemented. In accordance with this embodiment, the first chiplet die 102 of the system 300 shown in FIG. 3 further comprises at least a first instance of a second ASIL domain circuit 302a, preferably operating in a third clock and power domain defined by a third supply voltage and a third clock signal generated by third clock and power domain circuitry 303. The third clock signal operates at a third clock frequency.

The second chiplet die 110 of the system 300 shown in FIG. 3 further comprises at least a second instance of the second ASIL domain circuit 302b, which preferably operates in a fourth clock and power domain defined by a fourth supply voltage and a fourth clock signal generated by fourth clock and power domain circuitry 304. The third and fourth clock signals operate at third and fourth clock frequencies, respectively, which are typically the same but could be different. The first, second, third and fourth power and clock domain circuits 104, 113, 303 and 304, respectively, preferably are independent of one another so that a fault or failure of one of them does not detrimentally impact the others.

In the first chiplet die 102, the first instance of the second ASIL domain circuit 302a preferably is electrically isolated from the first instance of the first ASIL domain circuit 103a. Likewise, in the second chiplet die 110, the second instance of the second ASIL domain circuit 302b preferably is electrically isolated from the second instance of the first ASIL domain circuit 103b. As indicated above with reference to FIG. 1, the first and second chiplet dies 102 and 110, respectively, preferably are electrically isolated from one another. This electrical isolation and the use of independent power and clock domains help ensure that a fault or failure in one part of the system 300 does not detrimentally impact other parts of the system 300.

In accordance with this exemplary embodiment, in addition to the first chiplet die 102 and the second chiplet die 110 providing redundant ASIL execution channels for one another, the first instance of the first ASIL domain circuit 103*a* provides a redundant ASIL execution channel for the first instance of the second ASIL domain circuit 302*a*. Likewise, the second instance of the first ASIL domain circuit 103*b* provides a redundant ASIL execution channel for the second instance of the second ASIL domain circuit 302*b*.

In accordance with this exemplary embodiment, the ASIL domain circuits 103*a* and 103*b* are up-to-ASIL D domain circuits configured to perform ASIL A-D operations and the ASIL domain circuits 302*a* and 302*b* are up-to-ASIL B domain circuits configured to perform ASIL A-B operations. The sensor output signals received by the up-to-ASIL D domain circuits 103*a* and 103*b* are from ASIL A-D domain sensors, whereas the sensor output signals received by the up-to-ASIL B domain circuits 302*a* and 302*b* are from ASIL A-B domain sensors. Thus, in system 300, there is sensor output signal redundancy for the ASIL A-B domain sensors.

In addition to being configured to perform ASIL D domain processing of the ASIL D domain sensor output signals, the up-to-ASIL D domain circuits 103*a* and 103*b* can also be configured to perform ASIL B domain processing of the ASIL B domain sensor output signals to verify that the output signals 307 and 308 of the up-to-ASIL B domain circuits 302*a* and 302*b*, respectively, are valid before outputting those results as output signals 105 and 115, respectively. In this way, the up-to-ASIL D domain circuits 103*a* and 103*b* provide ASIL B domain execution redundancy for the up-to-ASIL B domain circuits 302*a* and 302*b*, respectively.

Another benefit of this embodiment is that the ASIL D domain circuits 103*a*, 103*b* can also help enhance the overall ASIL level of outputs 105 and 115 through ASIL decomposition. For example, ASIL B domain circuit 302*a* does ASIL B domain processing and provides the corresponding output signal 307 to ASIL D domain circuit 103*a*. ASIL D domain circuit 103*a* performs additional independent processing of the ASIL B domain output signal 307 and then provides a higher, or more robust, ASIL D level output signal 105. Additionally, because the ASIL D domain circuits 103*a*, 103*b* in this embodiment receive separate sets of independent sensor output signals, this helps with higher ASIL level verification of the ASIL B domain output signals 307, 308, thereby enhancing the overall ASIL level of output signals 105 and 115.

If the fault monitoring system 120 detects an EE or software fault or failure in the up-to-ASIL B domain circuit 302*a*, it notifies the up-to-ASIL D domain circuit 103*a*, which then either verifies that the output signal 307 is valid and outputs signal 307 as output signal 105 or determines that the validity of the output signal 307 cannot be verified. In the latter case, the value of the output signal 105 can depend on whether the system 300 is designed and configured to perform Fail-safe or Fail-operational behavior. If the system 300 is designed and configured to perform Fail-safe behavior, the value of the output signal 105 may inform the external system monitor 106 that the associated ASIL B domain sensor (e.g., a rearwardly-facing camera) output cannot be trusted, which may then cause the driver of the vehicle to be informed by a visual or audio signal that the sensor output cannot be trusted. If the system 300 is designed and configured to perform Fail-operational behavior, the up-to-ASIL D domain circuit 103*a* may process the ASIL B domain sensor output signals to generate the correct value and output it as the output signal 105.

The second instance of the up-to-ASIL D domain circuit 103*b* processes the output signal 308 of the second instance of the up-to-ASIL B domain circuit 302*b* as described above to provide ASIL B domain execution redundancy for the second instance of the up-to-ASIL B domain circuit 302*b*. If the fault monitoring system 120 detects an EE or software fault or failure in the second instance of the up-to-ASIL B domain circuit 302*b*, it notifies the second instance of the up-to-ASIL D domain circuit 103*b*, which then either verifies that the output signal 308 is valid and outputs it as output signal 115 or determines that the validity of the output signal 308 cannot be verified and takes appropriate steps to provide Fail-safe or Fail-operational performance according to the design and configuration of the system 300.

As indicated above, the first and second chiplet dies 102 and 110, respectively, also provide ASIL domain execution redundancy for one another in a manner similar to that described above with reference to FIG. 1. If the fault monitoring system 120 of the system 300 detects a fault in the first chiplet die 102, it causes the selector circuit 121 to select the output signal 115 of the second instance of the up-to-ASIL D domain circuit 103*b* to be input to the external system monitor 106, which then takes the appropriate action for achieving Fail-safe or Fail-operational behavior according to the design and configuration of the system 300.

It should also be noted that in some embodiments, the system 300 can be designed such that if the fault monitoring system 120 has detected a fault in the first chiplet die 102, switched the selector circuit 121 to have output signal 115 sent to the external system monitor 106, and then detects a fault or failure in the second chiplet die 110 while the output signal 115 is being sent to the external system monitor 106, the fault monitoring system 120 can subsequently cause the selector circuit 121 to select the output signal 105 of the first instance of the first up-to-ASIL D domain circuit 103*a* to be input to the external system monitor 106. In this scenario, however, the first chiplet die 102 may need to be rebooted or subjected to whatever action is needed to recover it from the fault before switching back to using output signal 105 as the input to the external system monitor 106. It should be noted that in this representative embodiment, the output signals 105 and 115 can be up-to-ASIL D domain processing results that are based on the processing of ASIL A-D domain input signals.

It should be noted that although the fault monitoring system 120 is shown in FIG. 3 as being external to the first and second chiplet dies 102 and 110, respectively, it can comprise fault monitoring circuits that are part of one or both of the chiplet dies 102 and 110 or distributed across them, as will be described below in more detail. In addition, the system 300 can include an additional external fault monitoring circuit to provide additional fault monitoring redundancy. Also, in embodiments in which the fault monitoring system 120 comprises fault monitoring circuits that are in each of the dies 102 and 110, the fault monitoring circuits of each die 102 and 110 can be in communication with one another to make one another aware of any fault that is detected in the other die.

It should be noted that ASIL compliance as per ISO 26262 standard has two main aspects. The first aspect is meeting hardware architectural metrics up to the targeted ASIL level as described in ISO 26262 standard. This first aspect focuses on detection of random hardware faults within various elements of the target system and meeting of metrics such as the single point fault metric (SPFM), the latent fault metric (LFM), etc., as described and recommended in the ISO 26262 standard. The second aspect of ASIL compliance is avoidance of systematic faults. This means development of hardware and software elements of the system with the best known industry practices, quality, and most importantly, with guidance and recommendations for systematic development provided in the ISO 26262 standard. In other words, this second aspect focuses on hardware and software development processes for avoidance of bugs or systematic faults.

In the present disclosure and by specific example, both chiplet dies 102 and 110 preferably are developed to the highest ASIL level of ASIL D from a systematic fault avoidance standpoint. This means that processing circuits 103b, 302b,103a and 302a preferably are all developed to the highest ASIL level of ASIL D from a systematic development and fault avoidance standpoint.

Driven by the safety analysis and safety requirements, the power and clock domain circuits 104, 303, 113 and 304 supplying power and clock to these SOC circuits preferably are also developed to the highest ASIL level of ASIL D from a systematic development and fault avoidance standpoint.

Overall, this means that even if certain processing circuits are targeting ASIL B from a hardware architectural metric standpoint, they preferably are developed to the highest ASIL level of ASIL D from a systematic development standpoint. This approach allows certain ASIL decomposition guidelines in the ISO 26262 standard to be met in case ASIL decomposition is applied to meet safety requirements using processing circuits and chiplet dies 102 and 110 of the SOC 101 that maybe at lower ASIL levels (e.g., ASIL B) whereas the overall ASIL requirement is at higher ASIL level (e.g. ASIL D).

Figure 4:
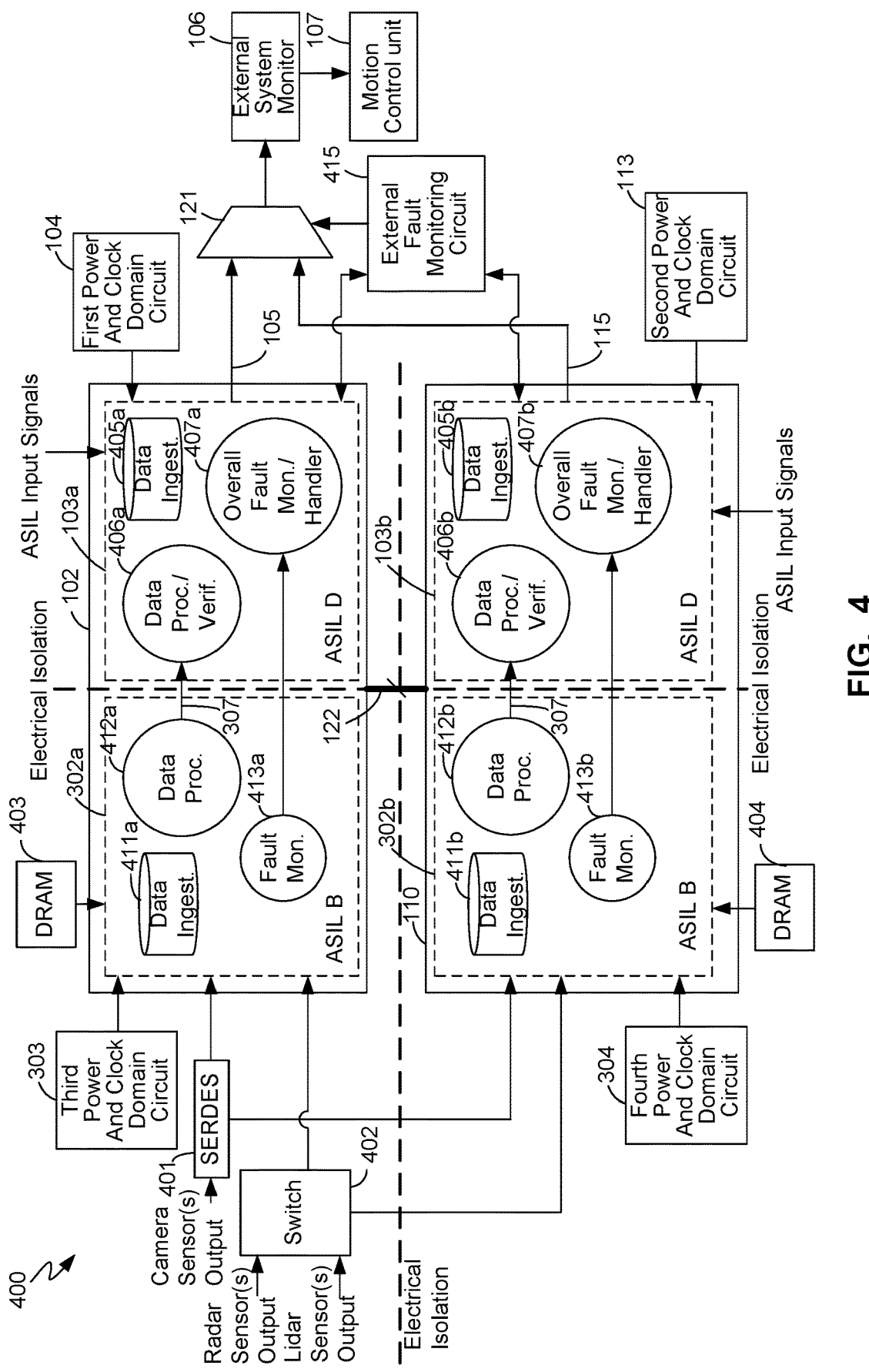
FIG. 4 is a block diagram of an automotive fault detection and recovery system in accordance with an exemplary embodiment that achieves at least one of Fail-safe behavior and Fail-operational behavior, depending on the manner in which the system is designed and implemented.

FIG. 4 is a block diagram of an automotive fault detection and recovery system 400 in accordance with an exemplary embodiment that achieves Fail-operational safety using at least the first and second chiplet dies 102 and 110, respectively, on a single SoC (not shown), where the first chiplet die 102 acts as the primary channel and the second chiplet die 110 acts as the fall-back channel. In accordance with this exemplary embodiment, the same set of sensor output signals are relayed to both chiplet dies 102 and 110. For exemplary purposes, the sensor output signals are represented by output signals of one or more cameras, one or more radar sensors and one or more lidar sensors.

The output signals of the camera(s) are received by a serializer/deserializer (SERDES) device 401. The output signals of the radar and lidar sensors are received by a switching device 402. The SERDES component 401 of the SoC converts the streams of camera output signals into first and second streams of output signals that are suitable for processing by the first and second chiplet dies 102 and 110, respectively. The switching device 402 multiplexes the radar and lidar sensor output signals to the first and second chiplet dies 102 and 110, respectively. Therefore, the chiplet dies 102 and 110 receive the same sensor output signals at the same time. One of the primary benefits of providing the same sensor signals to the chiplet dies 102 and 110 is that it allows the channel comprising the second chiplet die 110 to act as a fall-back channel. The fall-back channel receives all of the same sensor output signals that the primary channel receives, and does all of the required processing, but its output signal 115 is not used/valid until an error is detected in the first chiplet die 102.

The outputs shown from the SERDES 401 for the cameras, and from the switch 402 for Radar/Lidar make certain assumptions on sensor types and implementation. It will be understood that this can vary depending on sensor types, sensor interfaces to the chiplet dies 102, 110 and connectivity/multiplexing needs, etc. Therefore, FIG. 4 shows only an example of one such design/implementation and many others are possible and within the scope of the present disclosure.

In accordance with this exemplary embodiment, the first and second chiplet dies 102 and 110 each have their own dynamic random access memory (DRAM) devices 403 and 404, respectively, that store instructions for the ASIL domain processing algorithms that are executed by the ASIL domain processing circuits 103a, 103b, 302a, 302b. Therefore, the primary and backup channels also have redundancy in terms of the DRAM devices 403 and 404.

Although not explicitly shown in FIG. 4, the primary and fall-back channels comprising the chiplet dies 102 and 110, respectively, can have their own non-volatile memory (e.g., external memory connected via UFS, eMMC, PCIe, etc.). This storage space can be used be each chiplet die to load its boot software and for any other data storage needs, thereby providing further independence if needed from a non-volatile memory standpoint.

This exemplary embodiment is similar to the exemplary embodiment shown in FIG. 3, but the embodiment shown in FIG. 4 provides additional details regarding components that can comprise the ASIL processing circuits 103a, 103b, 302a and 302b. In accordance with this exemplary embodiment, the up-to-ASIL D processing circuit 103a comprises a data ingestion memory device 405a that stores digital representations of the sensor output signals, a data processing and verification circuit 406a that performs the up-to-ASIL D processing of the sensor output signals and an overall fault monitoring and handler circuit 407a that monitors the ASIL processing circuit 103a and the other ASIL processing circuits 103b, 302a and 302b for EE and software faults. The data processing and verification circuit 406a performs the up-to-ASIL D processing of the processing circuit 103a and also processes the output of the up-to-ASIL B processing circuit 302a to verify the validity of it before outputting it as output signal 105 or as a component of output signal 105.

Similarly, the up-to-ASIL B processing circuit 302a comprises a data ingestion memory device 411a that stores digital representations of the sensor output signals, a data processing circuit 412a that performs the up-to-ASIL B processing of the sensor output signals and a fault monitoring circuit 413a that monitors the ASIL B processing circuit 302a for EE and software faults. The data processing circuit 412a performs the up-to-ASIL B processing for the processing circuit 302a and produces output signal 307.

The up-to-ASIL D and B processing circuits 103b and 302b of the second chiplet die 110 are identical to the up-to-ASIL D and B processing circuits 103a and 302a, respectively, of the first chiplet die 102, although there may or may not be minor differences for purposes of achieving the aforementioned implementation diversity. For ease of discussion, it will be assumed herein that they are identically configured. Thus, components 405a-407a are identical to components 405b-407b, respectively, and components 411a-413a are identical to components 411b-413b, respectively.

Control signals and data can be exchanged between the chiplet dies 102 and 110 via the D2D interface 122. The overall fault monitoring and handler circuits 407a and 407b receive communications from the fault monitoring circuits 413a and 413b, respectively. In addition, the fault monitoring and handler circuits 407a and 407b communicate with one another via the D2D interface 122 to send a software heartbeat signal from the up-to-ASIL D processing circuit 103a to the up-to-ASIL D processing circuit 103b. In the event of a failure of the primary channel comprising chiplet die 102, this heartbeat signal will not be detected by the fault monitoring and handler circuit 407b, which will cause it to notify an external fault monitoring circuit 415 that the backup channel is taking control. The external fault monitoring circuit 415 will then cause the switching circuit 121 to select the output signal 115 of the ASIL D processing circuit 103b to be sent to the external system monitor 106. The backup channel comprising the second chiplet die 110 will then take over within the fault tolerant time interval (FTTI) of the system 400 to provide Fail-operational performance.

Figure 5:
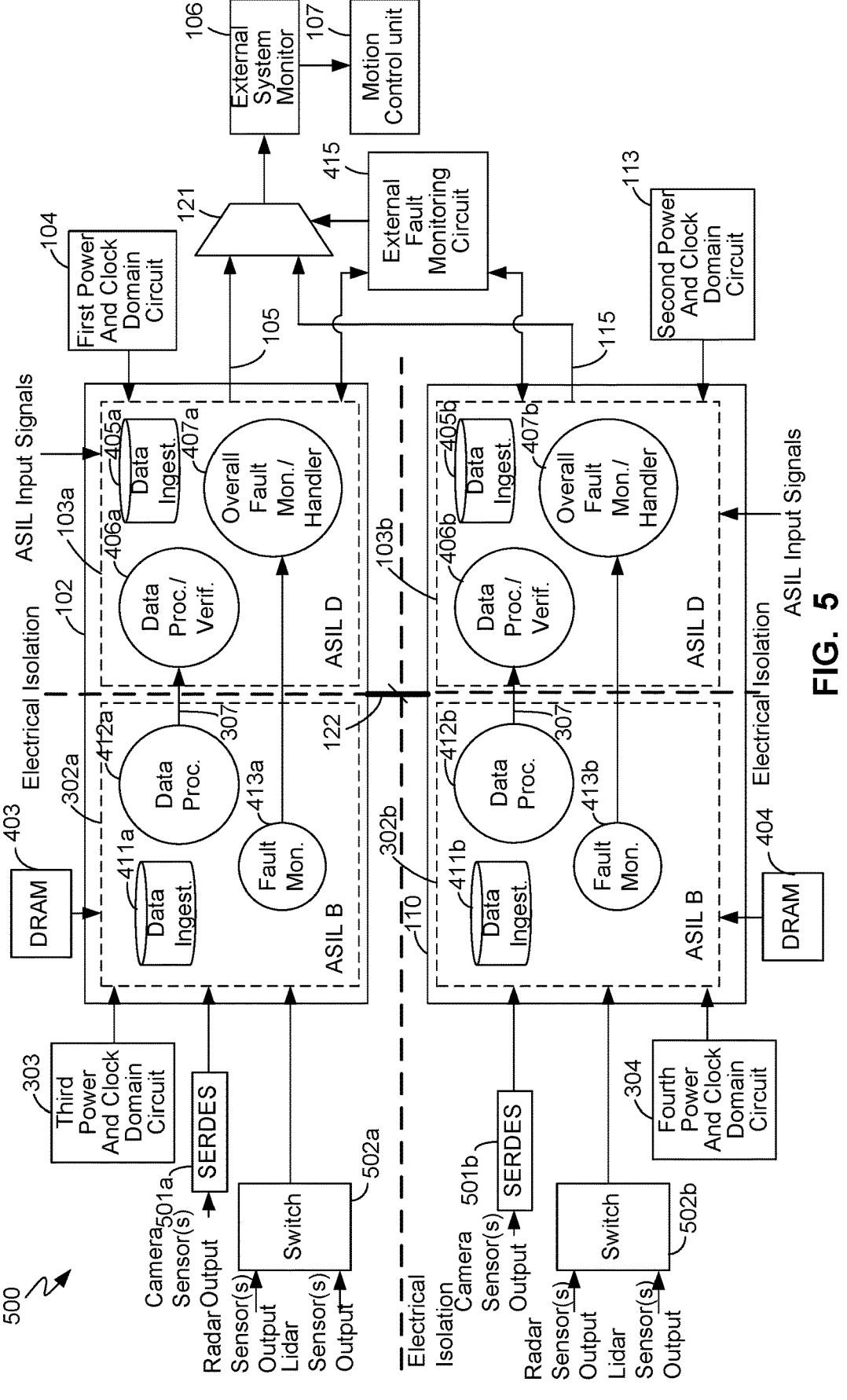
FIG. 5 is a block diagram of an automotive fault detection and recovery system in accordance with an exemplary embodiment in which first and second sets of sensors are used to generate the sensor output signals to achieve Fail-safe behavior with degraded mode of operations to perform an advanced minimum risk maneuver (MRM) in the event of a failure in one of the sets of sensors, in the respective chiplet die interface or in the respective chiplet die.

FIG. 5 is a block diagram of an automotive fault detection and recovery system 500 in accordance with an exemplary embodiment that is identical to the exemplary embodiment shown in FIG. 4 except that first and second sets of duplicate sensors are used to generate the sensor output signals, which are then processed by the first and second chiplet dies 102 and 110, respectively, to achieve Fail-safe performance. The first chiplet die 102 receives output signals of a first set of camera(s), radar sensor(s) and lidar sensor(s) while chiplet die 110 receives output signals of a second set of camera(s), radar sensor(s) and lidar sensor(s). The camera(s), lidar sensor(s) and radar sensor(s) of the first set can be identical to or different from the camera(s), lidar sensor(s) and radar sensor(s) of the second set, respectively. It should be noted that the sensors shown are for exemplary purposes only and that other types of sensors and sensor configurations can be used within the scope of the present disclosure.

The output signals of the cameras of the first and second sets are received by SERDES devices 501a and 501b, respectively. The output signals of the radar and lidar sensors of the first and second sets are received by switching devices 502a and 502b, respectively. The SERDES devices 501a and 501b convert the streams of camera output signals into respective streams of output signals that are suitable for processing by the first and second chiplet dies 102 and 110, respectively. The switching devices 502a and 502b multiplex the radar and lidar sensor output signals of the first and second sets to the first and second chiplet dies 102 and 110, respectively.

For this embodiment for achieving Fail-safe performance, the sensors are distributed across the two channels because it is assumed, for exemplary purposes, that both of the chiplet dies 102 and 110 are needed to do all of the sensor processing and to execute any other automated driving algorithms that have to be executed. Thus, this embodiment takes advantage of the high compute power of the chiplet dies 102, 110. Another benefit of this embodiment is that if one of the chiplet dies 102, 110 fails, the other chiplet die can continue to perform to allow Fail-safe behavior to be achieved while also allowing a MRM to be performed (e.g., pulling the vehicle over to the side of the road and safely stopping the vehicle and/or providing some reasonable timeframe for the driver to take back vehicle control).

As with the embodiment of FIG. 4, control signals and data can be exchanged between the chiplet dies 102 and 110 via the D2D interface 122. The overall fault monitoring and handler circuits 407a and 407b receive communications from the fault monitoring circuits 413a and 413b, respectively. In addition, the fault monitoring and handler circuits 407a and 407b communicate with one another via the D2D interface 122 to send a software heartbeat signal from the up-to-ASIL D processing circuit 103a to the up-to-ASIL D processing circuit 103b, and vice versa. In the event of a failure of the primary channel comprising chiplet die 102, this heartbeat signal will not be detected by the fault monitoring and handler circuit 407b, which will cause it to notify the external fault monitoring circuit 415 that chiplet die 110 is taking control. The external fault monitoring circuit 415 will then cause the switching circuit 121 to select the output signal 115 of the ASIL D processing circuit 103b to be sent to the external system monitor 106. The channel comprising the second chiplet die 110 will then take over within the FTTI of the system 500 to provide Fail-safe performance.

If a fault is detected in chiplet 102 causing chiplet 110 to take cover, then in the event of a failure of the backup channel comprising chiplet die 110, its heartbeat signal will not be detected by the fault monitoring and handler circuit 407a, which will cause circuit 407a to notify the external fault monitoring circuit 415 that chiplet die 102 is retaking control. Assuming chiplet 102 has been rebooted or otherwise recovered after the fault occurring in the primary channel, the external fault monitoring circuit 415 will then cause the switching circuit 121 to select the output signal 105 of the ASIL D processing circuit 103a to be sent to the external system monitor 106. The channel comprising the first chiplet die 102 will then take back over within the FTTI of the system 500 to provide Fail-safe performance with ability to perform an MRM. Thus, in some embodiments, the heartbeat signal is bidirectional and is used bidirectionally in that failure to detect it in circuit 407b results in the backup channel taking control and failure to detect it in circuit 407a can result in the primary channel retaking control.

Other scenarios are also possible. For example, assume an error was detected in chiplet die 102 and that chiplet die 110 took over to provide fail-safe performance and MRM. Meanwhile, chiplet die 102 was recovered from the error via rebooting or other mechanism/process. Subsequently, both chiplet dies 102 and 110 are available for execution. As another example, in the case in which an error was detected in chiplet die 102 and control is passed over to chiplet die 110, if an error is detected in chiplet die 110, then the external system monitor 106 can be configured to take over control and provide the necessary or desired fail-safe performance.

Because the chiplet dies 102 and 110 receive the sensor output signals from different sets of sensors, either channel is capable of providing diverse implementation of safety functions via ASIL decomposition. With ASIL decomposition, the ASIL B data processing circuits 412a and 412b redundantly process the sensor output signals in accordance with the same ASIL B safety function. The ASIL decomposition guidelines in the ISO 26262 standard are followed to have sufficient independence between these two redundant safety functions (e.g., hardware diversity, software implementation diversity, spatial separation, temporal separation, etc.). The outputs 307 of the data processing circuits 412a and 412b are then compared in the data processing and verification circuit 406a of the ASIL D domain processing circuit 103a to determine whether or not the outputs match or are similar enough. If so, one of these outputs are used as the output signal 105 or as a component of the output signal 105.

As an example, assuming the safety function is generating a trajectory for the vehicle in ASIL B data processing circuits 412a and 412b (ASIL B algorithms/processes), data processing and verification circuit 406a will compare these outputs and ensure that the outputs match or are similar within some expected range (this allows detection of E/E faults in either HW circuits, SW failures, etc., in circuits 412a and 412b, thereby elevating the overall ASIL level of the end output 105). If so, one of these outputs is used as the output signal 105 or as a component of the output signal 105.

Figure 6:
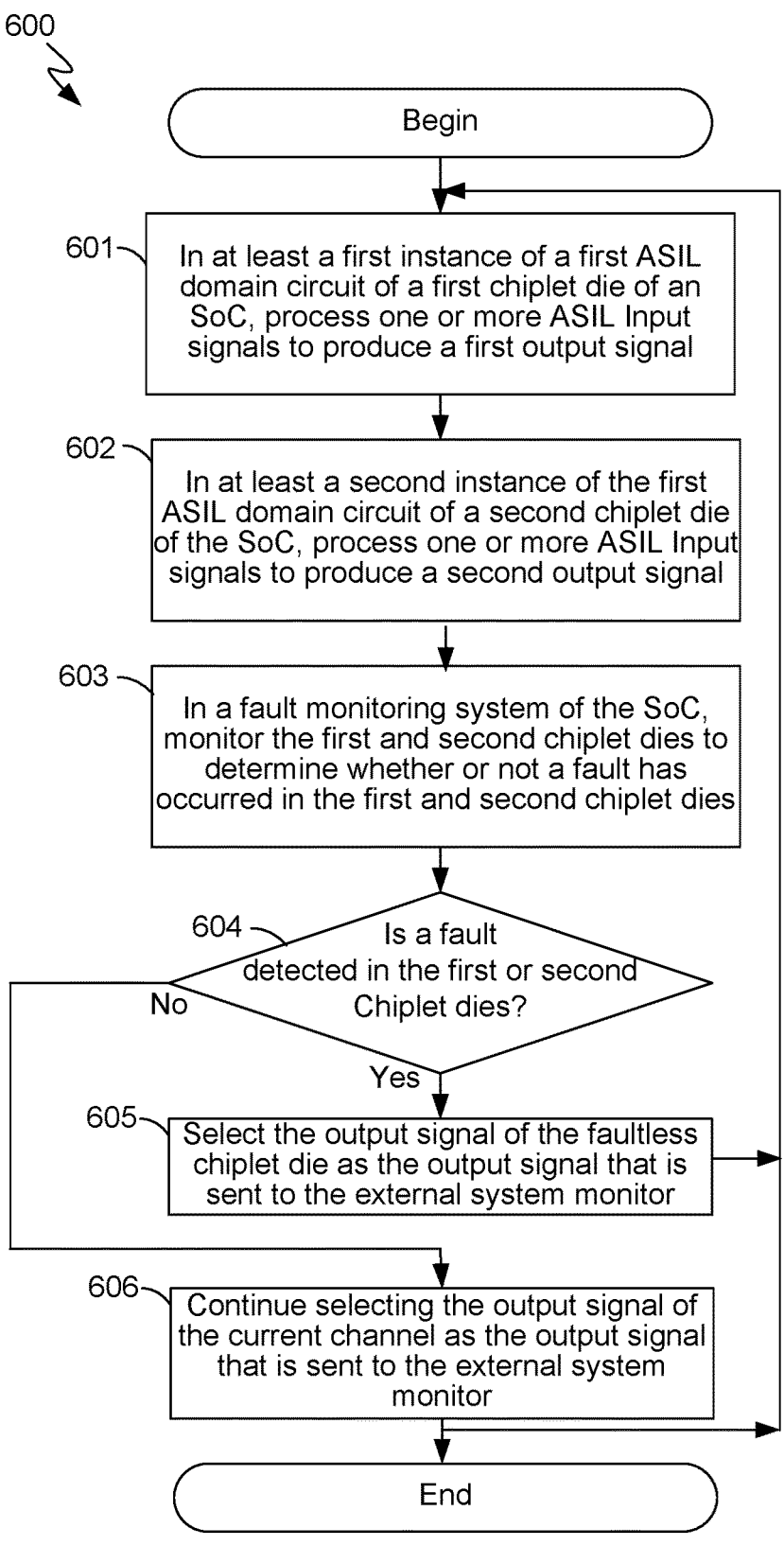
FIG. 6 is a flow diagram of the automotive fault monitoring and recovery method in accordance with an exemplary embodiment in which either channel can act as the primary or backup channel and both channels are monitored for faults.

FIG. 6 is a flow diagram of the automotive fault monitoring and recovery method 600 in accordance with an exemplary embodiment in which either channel can act as the primary or backup channel and both channels are monitored for faults. In at least a first instance of a first ASIL domain circuit of a first chiplet die of an SoC, one or more ASIL input signals are processed in accordance with a first ASIL domain process to produce a first output signal for use by an external system monitor, as indicated by block 601. In at least a second instance of the first ASIL domain circuit disposed on a second chiplet die of the first SoC, one or more ASIL input signals are processed in accordance with the first ASIL domain process to produce a second output signal for use by the external system monitor, as indicated by block 602.

In at least a first fault monitoring and detection system, the first and second chiplet dies are monitored to determine whether or not a fault has occurred in the first or second chiplet dies, as indicated by block 603. A determination is made at block 604 of whether or not a fault is detected in the first or second chiplet dies. If not, then the process proceeds to block 606 at which the system continues to select the output signal of the current channel to be sent to the external system monitor. The process can then return to block 601.

If it is determined a block 604 that a fault is detected in the first or second chiplet dies, then the selector signal generated by the fault monitoring and detection system causes the output signal of the faultless channel to be selected and sent to the external system monitor, as indicated by block 605. The process can then end or return to block 601 and repeat or the process can end or start over.

Additional steps not shown in FIG. 6 may also take place, such as, for example, rebooting or resetting the first or second chiplet dies after a fault has been detected, the external system monitor causing the vehicle to perform an MRM after a fault has been detected, the system displaying a message to the driver that a fault has been detected and that self-driving features are temporarily disabled, or the system causing some other Fail-operational or Fail-safe action to be performed after a fault has been detected.

FIG. 7 is a flow diagram of the automotive fault monitoring and recovery method 700 in accordance with an exemplary embodiment in which the first and second chiplet dies each comprise an ASIL B domain circuit and an ASIL D domain circuit, as depicted in FIGS. 4 and 5, and the primary channel comprises the first chiplet die. In at least first and second instances of an ASIL D domain circuit of first and second chiplet dies, respectively, of an SoC, ASIL input signals (e.g., sensor output signals) are processed in accordance with an ASIL D domain process or algorithm to produce first and second ASIL D output signals for use by an external system monitor, as indicated by block 701. In at least first and second instances of an ASIL B domain circuit of the first and second chiplet dies, respectively, ASIL input signals (e.g., automotive sensor output signals) are processed in accordance with an ASIL B domain process or algorithm to produce first and second ASIL B output signals for use by the external system monitor, as indicated by block 702.

In at least a first fault monitoring and detection system, at least the first chiplet die is monitored to determine whether or not a fault has occurred in the first chiplet die, as indicated by block 703. A determination is made at block 704 of whether or not a fault is detected in the first chiplet die. If not, the ASIL B and D output signals produced by the ASIL B and D domain circuits, respectively, of the first chiplet die are selected and sent to the external system monitor, as indicated by block 705. The process can then return to block 701 and repeat.

If it is determined at block 704 that a fault is detected in the first chiplet die, then the process proceeds to block 706 and a selector signal is generated that causes the ASIL B and D output signals of the second chiplet die to be selected and sent to the external system monitor. The process can then return to block 701 and repeat or the process can end or start over.

FIG. 8 is a flow diagram of the automotive fault monitoring and recovery method 800 in accordance with an exemplary embodiment in which ASIL decomposition is performed by comparing outputs of the first and second ASIL B domain circuits of the first and second chiplet dies, respectively, and using the comparison result to evaluate the overall correctness of the targeted ASIL D level output of the fault detection and recovery system. In the case where the outputs are not the same or similar as defined by the expected system design constraints or specifications, the comparison result will contain an error that informs the fault detection and recovery system to take necessary action. In the case where the outputs are the same or similar as per system design constraints or specifications, then the ASIL D level output is deemed correct for outputting to the next receiving entity in the system. The method shown in FIG. 8 can be performed in parallel with, or as an extension of, the method shown in FIG. 7.

In at least first and second instances of an ASIL B domain circuit of first and second chiplet dies, respectively, of an SoC, ASIL input signals are processed in accordance with an ASIL B domain process or algorithm to produce first and second ASIL B domain output signals, as indicated by block 801. In a first instance of an ASIL D domain circuit of the first chiplet die, receive the first and second ASIL B domain output signals, as indicated by block 802. In the first ASIL D domain circuit, compare the first and second ASIL B domain output signals to one another to determine whether the signals match or are sufficiently similar, as indicated by block 803. If so, the first or second ASIL B domain circuit output signals is used as the output signal of the first instance of the ASIL D domain circuit of the first chiplet die or as a component of the output signal of the first instance of the ASIL D domain circuit, as indicated by block 804. The process can then return to block 801 and repeat or the process can end. If a determination is made at block 803 that the first and second ASIL B domain output signals do not match or are not sufficiently similar, the fault detection and recovery system is informed that the correctness of the ASIL B domain circuit output signals cannot be verified, as indicated by block 805, in which case neither of the ASIL B domain circuit output signals is used as the output signal of the first instance of the ASIL D domain circuit.

With respect to block 804, in terms of implementation, there could be assignment of one of the ASIL B domain circuit output signals as the final output signal of the ASIL D domain circuit, as long as the ASIL B domain circuit output signals match or are sufficiently similar. For example, assuming that a high-level safety requirement of the system is to determine the presence of an obstacle in the path of the vehicle at ASIL D level and that two ASIL B domain circuits running some obstacle detection algorithms are tasked with determining the presence of an obstacle in front of the vehicle, the ASIL B domain circuits provide output results at ASIL B level. The role of the ASIL D domain circuit is to do the final comparison of the two ASIL B domain circuit output signals to make a final decision as to whether or not there is indeed an obstacle in front of the vehicle, while avoiding false positives, false negatives, etc., and that the vehicle should therefore apply the brakes.

In this example, the ASIL B domain circuits are tasked with performing the bulk of the computations to produce respective output signals and the ASIL D domain circuit is mainly tasked with the comparison, which is less computationally intensive, but has higher criticality in terms of avoiding incorrect comparison of the output signals to produce wrong final result, etc.

The systems shown in FIGS. 3-5 can be configured to perform decomposition in a number of ways. The examples and the embodiments described above are provided to demonstrate a few examples of the manner in which the fault detection and recovery systems disclosed herein can perform decomposition processes. Persons of skill in the art will understand how these systems can perform a variety of decomposition processes in view of the description provided herein.

FIG. 9 is a pictorial image of an automobile 900 in which any of the systems 100, 300, 400 or 500 shown in FIGS. 1, 3, 4 and 5 performing any of the methods 200, 600, 700 or 800 shown in FIG. 2, 6, 7 or 8, or combinations thereof is incorporated as part of an ADAS/ADS system of the automobile 900. The outputs of the external system monitor 106 are used by the MCU 107 and/or by other components of an ADAS/ADS system downstream of the external system monitor 106 to control behavior of the automobile while achieving Fail-safe or Fail-operational performance, depending on the manner in which the target system is implemented. It should be noted, however, that the systems 100, 300, 400 or 500 performing any of the methods 200, 600, 700 or 800 or combinations thereof may be incorporated into any type of self-propelled mobile platform for which Fail-safe or Fail-operational performance is desired or needed, including, for example, automobiles, boats, ships, airplanes, jets, trains, drones, robots, etc.

Implementation examples are described in the following numbered clauses:

1. An automotive fault detection and recovery system comprising:

at least first and second chiplet dies disposed in a system-on-a-chip (SoC) integrated circuit (IC) package and being in communication with one another via a die-to-die interface, the first and second chiplet dies comprising at least first and second instances of a first automotive safety integrity level (ASIL) domain circuit, respectively, the first and second instances of the first ASIL domain circuit being configured to perform at least a first ASIL domain process on one or more ASIL input signals to produce first and second output signals, respectively, that are outputted from the first and second instances, respectively, of the first ASIL domain circuit;

a selector circuit configured to select one of the first and second output signals based on a value assigned to a selector signal received by the selector circuit; and a fault monitoring system configured to monitor the first and second chiplet dies and to assign a first value to the selector signal if the fault monitoring system detects a fault in the first chiplet die, wherein assignment of the first value to the selector signal causes the second output signal to be output from the automotive fault detection and recovery system.

2. The automotive fault detection and recovery system of clause 1, wherein the first and second chiplet dies are configured to operate in separate clock and power domains that are independent of one another.

3. The automotive fault detection and recovery system of any of clauses 1 and 2, wherein the fault monitoring system is further configured to assign a second value to the selector signal if the fault monitoring system detects a fault in the second chiplet die, wherein assignment of the second value to the selector signal causes the first output signal to be output from the automotive fault detection and recovery system.

4. The automotive fault detection and recovery system of any of clauses 1-3, wherein the first and second chiplet dies further comprise at least first and second instances, respectively, of a second ASIL domain circuit configured to perform at least a second ASIL domain process on one or more ASIL input signals to produce third and fourth output signals, respectively.

5. The automotive fault detection and recovery system of any of clauses 1-4, wherein the first and second instances of the first ASIL domain circuit are configured to operate in first and second clock and power domains, respectively, that are independent of one another, and wherein the first and second instances of the second ASIL domain circuit are configured to operate in third and fourth clock and power domains, respectively, that are independent of one another and independent of the first and second clock and power domains.

6. The automotive fault detection and recovery system of any of clauses 1-5, wherein the first instances of the first and second ASIL domain circuits are in communication with, and electrically isolated from, one another, and wherein the second instances of the first and second ASIL domain circuits are in communication with, and electrically isolated from, one another.

7. The automotive fault detection and recovery system of any of clauses 1-6, wherein the first and second chiplet dies are electrically isolated from one another such that a fault that occurs in the first chiplet die is not cascaded into the second chiplet die, and vice versa.

8. The automotive fault detection and recovery system of any of clauses 1-4, wherein the first and second instances of the first ASIL domain circuit are first and second instances, respectively, of an up-to-ASIL D domain circuit, the first ASIL domain process comprising at least an up-to-ASIL D domain process, and wherein the first and second instances of the second ASIL domain circuit are first and second instances, respectively, of an up-to-ASIL B domain circuit, the second ASIL domain process comprising at least an up-to-ASIL B domain process.

9. The automotive fault detection and recovery system of clause 8, wherein the third and fourth output signals are compared to one another by the first instance of the up-to-ASIL D domain circuit to produce a comparison result that is processed by the first instance of the up-to-ASIL D domain circuit to determine whether or not a correctness of the comparison result can be verified, and wherein if the first instance of the up-to-ASIL D domain circuit verifies the correctness of the comparison result, one of the third and fourth output signals is outputted by the first instance of the up-to-ASIL D domain circuit as the first output signal or as a component of the first output signal.

10. The automotive fault detection and recovery system of any of clauses 8 and 9, wherein the first instance of the first up-to-ASIL D domain circuit is further configured to process the third output signal produced by the first instance of the up-to-ASIL B domain circuit to verify a validity of the third output signal.

11. The automotive fault detection and recovery system of any of clauses 8-10, wherein the second instance of the first up-to-ASIL D domain circuit is further configured to process the fourth output signal produced by the second instance of the up-to-ASIL B domain circuit to verify a validity of the fourth output signal.

12. The automotive fault detection and recovery system of any of clauses 1-4, wherein the fault monitoring system comprises:

a first fault monitoring circuit disposed in the first chiplet die and configured to detect faults in the first instance of the first ASIL domain circuit and to assign the first value to the selector signal if a fault is detected by the first fault monitoring circuit.

13. The automotive fault detection and recovery system of clause 12, wherein the fault monitoring system further comprises:

a second fault monitoring circuit disposed in the second chiplet die and configured to detect faults in the second instance of the first ASIL domain circuit and to forward faults detected in the second instance of the first ASIL domain circuit to the first fault monitoring circuit.

14. The automotive fault detection and recovery system of clauses 12 and 13, wherein the first fault monitoring circuit is further configured to forward faults detected in the first instance of the first ASIL domain circuit to the second fault monitoring circuit.

15. The automotive fault detection and recovery system of any of clauses 12-14, wherein the fault monitoring system further comprises:

a third fault monitoring circuit disposed in the first chiplet die and in communication with the first fault monitoring circuit, the third fault monitoring circuit being configured to detect faults in the first instance of the second ASIL domain circuit and to inform the first fault monitoring circuit if a fault is detected by the third fault monitoring circuit; and a fourth fault monitoring circuit disposed in the second chiplet die and in communication with the second fault monitoring circuit, the fourth fault monitoring circuit being configured to detect faults in the second instance of the second ASIL domain circuit and to inform the second fault monitoring circuit if a fault is detected by the fourth fault monitoring circuit.

16. The automotive fault detection and recovery system of any of clauses 12-15, further comprising:

an external fault monitoring system in communication with the first and second chiplet dies, and wherein the first fault monitoring circuit is further configured to transmit a heartbeat signal to the second fault monitoring circuit, and wherein if the second fault monitoring circuit fails to detect the heartbeat signal, the second fault monitoring circuit notifies the external fault detection system of a failure in the first chiplet die, and wherein upon being notified of the failure in the first chiplet die, the external fault monitoring system assigns the first value to the selector signal to cause the second output signal to be output from the automotive fault detection and recovery system.

17. A method for performing automotive fault detection and recovery in an automotive fault detection and recovery system comprising:

in first and second instances of a first automotive safety integrity level (ASIL) domain circuit of first and second chiplet dies, respectively, disposed in a system-on-a-chip (SoC) integrated circuit (IC) package, performing at least a first ASIL domain process on one or more ASIL input signals to produce first and second output signals, respectively, that are outputted from the first and second instances of the first ASIL domain circuit, respectively, the first and second chiplet dies being interfaced with one another via a die-to-die interface to enable the first and second chiplet dies to communicate with one another;

with a fault monitoring system, monitoring at least the first chiplet die for faults and assigning a first value to a selector signal if the fault monitoring system detects a fault in the first chiplet die; and with a selector circuit that receives the selector signal and the first and second output signals, outputting the second output signal from the automotive fault detection and recovery system if the selector signal has been assigned the first value.

18. The method of clause 17, further comprising:

with the fault monitoring system, monitoring at least the second chiplet die for faults and assigning a second value to the selector signal if the fault monitoring system detects a fault in the second chiplet die; and with the selector circuit, outputting the first output signal from the automotive fault detection and recovery system if the selector signal has been assigned the second value.

19. The method of any of clauses 17 and 18, wherein the first and second chiplet dies further comprise at least first and second instances, respectively, of a second ASIL domain circuit configured to perform at least a second ASIL domain process on one or more ASIL input signals to produce third and fourth output signals, respectively.

20. The method of any of clauses 17-19, wherein the first and second instances of the first ASIL domain circuit are first and second instances, respectively, of an up-to-ASIL D domain circuit, the first ASIL domain process comprising at least an up-to-ASIL D domain process, and wherein the first and second instances of the second ASIL domain circuit are first and second instances, respectively, of an up-to-ASIL B domain circuit, the second ASIL domain process comprising at least an up-to-ASIL B domain process.

21. The method of any of clauses 17-20, further comprising:

in the first instance of the up-to-ASIL D domain circuit, performing decomposition by:

comparing the third and fourth output signals to one another to produce a comparison result;

processing the comparison result to determine whether or not a correctness of the comparison result can be verified; and if the first instance of the up-to-ASIL D domain circuit verifies the correctness of the comparison result, outputting one of the third and fourth output signals as the first output signal or as a component of the first output signal.

22. The method of any of clauses 19-21, further comprising:

in the first instance of the first up-to-ASIL D domain circuit, processing the third output signal produced by the first instance of the up-to-ASIL B domain circuit to verify a validity of the third output signal.

23. The method of any of clauses 19-22, further comprising:

in the second instance of the up-to-ASIL D domain circuit, processing the fourth output signal produced by the second instance of the up-to-ASIL B domain circuit to verify a validity of the fourth output signal.

24. The method of any of clauses 17-23, wherein the fault monitoring system comprises a first fault monitoring circuit disposed in the first chiplet die, the method further comprising:

with the first fault monitoring circuit, detecting faults in the first instance of the first ASIL domain circuit and assigning the first value to the selector signal if a fault is detected in the first instance of the first ASIL domain circuit by the first fault monitoring circuit.

25. The method of any of clauses 17-24, wherein the fault monitoring system further comprises a second fault monitoring circuit disposed in the second chiplet die, the method further comprising:

with the second fault monitoring circuit, detecting faults in the second instance of the first ASIL domain circuit and forwarding faults detected in the second instance of the first ASIL domain circuit to the first fault monitoring circuit.

26. The method of any of clauses 17-25, further comprising:

with the first fault monitoring circuit, forwarding faults detected in the first instance of the first ASIL domain circuit to the second fault monitoring circuit.

27. The method of any of clauses 24-26, wherein the fault monitoring system further comprises a third fault monitoring circuit disposed in the first chiplet die and in communication with the first fault monitoring circuit, the method further comprising:

with the third fault monitoring circuit, detecting faults in the first instance of the second ASIL domain circuit and informing the first fault monitoring circuit if a fault is detected by the third fault monitoring circuit; and with a fourth fault monitoring circuit disposed in the second chiplet die and in communication with the second fault monitoring circuit, detecting faults in the second instance of the second ASIL domain circuit and informing the second fault monitoring circuit if a fault is detected by the fourth fault monitoring circuit.

28. The method of any of clauses 25-27, further comprising an external fault monitoring system in communication with the first and second chiplet dies, the method further comprising:

between the first and second fault monitoring circuits, transmitting a bidirectional heartbeat signal;

in the first and second fault monitoring circuits, determining whether there has been a failure to detect the bidirectional heartbeat signal, and if so, notifying the external fault detection system of the failure to detect the bidirectional heartbeat signal; and with the external monitoring system, upon being notified of the failure, assigning the first value to the selector signal if the second fault monitoring circuit failed to detect the bidirectional heartbeat signal and assigning the second value to the selector signal if the first fault monitoring circuit failed to detect the bidirectional heartbeat signal.

29. A non-transitory computer-readable medium comprising computer instructions for execution by at least first and second chiplet dies disposed in a system-on-a-chip (SoC) integrated circuit (IC) package of an automotive fault detection and recovery system, the first and second chiplet dies being in communication with one another via a die-to-die interface, the computer instructions comprising:

first and second sets of computer instructions for execution by the first and second chiplet dies, respectively, to perform a first automotive safety integrity level (ASIL) domain process on one or more ASIL input signals to produce first and second output signals, respectively, that are outputted from the first and second chiplet dies, respectively;

a third set of computer instructions for causing a selector circuit to select one of the first and second output signals to be outputted from the automotive fault detection and recovery system based on a value assigned to a selector signal received by the selector circuit; and a fourth set of computer instructions for monitoring the first and second chiplet dies for faults and for assigning a first value to the selector signal if the fault monitoring system detects a fault in the first chiplet die, wherein assignment of the first value to the selector signal causes the second output signal to be outputted from the automotive fault detection and recovery system by the selector circuit.

30. An automotive fault detection and recovery system comprising:

at least first and second chiplet dies disposed in a system-on-a-chip (SoC) integrated circuit (IC) package and being in communication with one another via a die-to-die interface, the first and second chiplet dies comprising at least a first and second means for performing at least a first ASIL domain process on one or more ASIL input signals to produce first and second output signals, respectively;

means for selecting one of the first and second output signals to be outputted from the automotive fault detection and recovery system based on a value assigned to a selector signal received by the means for selecting; and means for monitoring the first and second chiplet dies and for assigning a first value to the selector signal if the means for monitoring detects a fault in the first chiplet die, wherein assignment of the first value to the selector signal causes the second output signal to be outputted from the automotive fault detection and recovery system.

Alternative embodiments will become apparent to one of ordinary skill in the art to which the invention pertains. Therefore, although selected aspects have been illustrated and described in detail, it will be understood that various substitutions and alterations may be made therein, and that all such modifications are within the scope of the present disclosure.

What is claimed is:

1. An automotive fault detection and recovery system comprising:

at least first and second chiplet dies disposed in a system-on-a-chip (SoC) integrated circuit (IC) package and being in communication with one another via a die-to-die interface, the first and second chiplet dies comprising at least first and second instances of a first automotive safety integrity level (ASIL) domain circuit, respectively, the first and second instances of the first ASIL domain circuit being configured to perform at least a first ASIL domain process on one or more ASIL input signals to produce first and second output signals, respectively, that are outputted from the first and second instances, respectively, of the first ASIL domain circuit;

a selector circuit configured to select one of the first and second output signals based on a value assigned to a selector signal received by the selector circuit and configured to provide a selected one of the first and second output signals to an automotive control unit input signal path; and a fault monitoring system configured to monitor the first and second chiplet dies and to assign a first value to the selector signal if the fault monitoring system detects a fault in the first chiplet die, wherein assignment of the first value to the selector signal causes the second output signal to be output from the automotive fault detection and recovery system.

2. The automotive fault detection and recovery system of claim 1, wherein the first and second chiplet dies are configured to operate in separate clock and power domains that are independent of one another.

3. The automotive fault detection and recovery system of claim 1, wherein the fault monitoring system is further configured to assign a second value to the selector signal if the fault monitoring system detects a fault in the second chiplet die, wherein assignment of the second value to the selector signal causes the first output signal to be output from the automotive fault detection and recovery system.

4. The automotive fault detection and recovery system of claim 1, wherein the first and second chiplet dies further comprise at least first and second instances, respectively, of a second ASIL domain circuit configured to perform at least a second ASIL domain process on one or more ASIL input signals to produce third and fourth output signals, respectively.

5. The automotive fault detection and recovery system of claim 4, wherein the first and second instances of the first ASIL domain circuit are configured to operate in first and second clock and power domains, respectively, that are independent of one another, and wherein the first and second instances of the second ASIL domain circuit are configured to operate in third and fourth clock and power domains, respectively, that are independent of one another and independent of the first and second clock and power domains.

6. The automotive fault detection and recovery system of claim 5, wherein the first instances of the first and second ASIL domain circuits are in communication with, and electrically isolated from, one another, and wherein the second instances of the first and second ASIL domain circuits are in communication with, and electrically isolated from, one another.

7. The automotive fault detection and recovery system of claim 1, wherein the first and second chiplet dies are electrically isolated from one another such that a fault that occurs in the first chiplet die is not cascaded into the second chiplet die, and vice versa.

8. The automotive fault detection and recovery system of claim 4, wherein the first and second instances of the first ASIL domain circuit are first and second instances, respectively, of an up-to-ASIL D domain circuit, the first ASIL domain process comprising at least an up-to-ASIL D domain process, and wherein the first and second instances of the second ASIL domain circuit are first and second instances, respectively, of an up-to-ASIL B domain circuit, the second ASIL domain process comprising at least an up-to-ASIL B domain process.

9. The automotive fault detection and recovery system of claim 8, wherein the third and fourth output signals are compared to one another by the first instance of the up-to-ASIL D domain circuit to produce a comparison result that is processed by the first instance of the up-to-ASIL D domain circuit to determine whether or not a correctness of the comparison result can be verified, and wherein if the first instance of the up-to-ASIL D domain circuit verifies the correctness of the comparison result, one of the third and fourth output signals is outputted by the first instance of the up-to-ASIL D domain circuit as the first output signal or as a component of the first output signal.

10. The automotive fault detection and recovery system of claim 8, wherein the first instance of the first up-to-ASIL D domain circuit is further configured to process the third output signal produced by the first instance of the up-to-ASIL B domain circuit to verify a validity of the third output signal.

11. The automotive fault detection and recovery system of claim 10, wherein the second instance of the first up-to-ASIL D domain circuit is further configured to process the fourth output signal produced by the second instance of the up-to-ASIL B domain circuit to verify a validity of the fourth output signal.

12. The automotive fault detection and recovery system of claim 4, wherein the fault monitoring system comprises:

a first fault monitoring circuit disposed in the first chiplet die and configured to detect faults in the first instance of the first ASIL domain circuit and to assign the first value to the selector signal if a fault is detected by the first fault monitoring circuit.

13. The automotive fault detection and recovery system of claim 12, wherein the fault monitoring system further comprises:

a second fault monitoring circuit disposed in the second chiplet die and configured to detect faults in the second instance of the first ASIL domain circuit and to forward faults detected in the second instance of the first ASIL domain circuit to the first fault monitoring circuit.

14. The automotive fault detection and recovery system of claim 13, wherein the first fault monitoring circuit is further configured to forward faults detected in the first instance of the first ASIL domain circuit to the second fault monitoring circuit.

15. The automotive fault detection and recovery system of claim 14, wherein the fault monitoring system further comprises:

a third fault monitoring circuit disposed in the first chiplet die and in communication with the first fault monitoring circuit, the third fault monitoring circuit being configured to detect faults in the first instance of the second ASIL domain circuit and to inform the first fault monitoring circuit if a fault is detected by the third fault monitoring circuit; and a fourth fault monitoring circuit disposed in the second chiplet die and in communication with the second fault monitoring circuit, the fourth fault monitoring circuit being configured to detect faults in the second instance of the second ASIL domain circuit and to inform the second fault monitoring circuit if a fault is detected by the fourth fault monitoring circuit.

16. The automotive fault detection and recovery system of claim 15, further comprising:

an external fault monitoring system in communication with the first and second chiplet dies, and wherein the first fault monitoring circuit is further configured to transmit a heartbeat signal to the second fault monitoring circuit, and wherein if the second fault monitoring circuit fails to detect the heartbeat signal, the second fault monitoring circuit notifies the external fault detection system of a failure in the first chiplet die, and wherein upon being notified of the failure in the first chiplet die, the external fault monitoring system assigns the first value to the selector signal to cause the second output signal to be output from the automotive fault detection and recovery system.

17. A method for performing automotive fault detection and recovery in an automotive fault detection and recovery system comprising:

in first and second instances of a first automotive safety integrity level (ASIL) domain circuit of first and second chiplet dies, respectively, disposed in a system-on-a-chip (SoC) integrated circuit (IC) package, performing at least a first ASIL domain process on one or more ASIL input signals to produce first and second output signals, respectively, that are outputted from the first and second instances of the first ASIL domain circuit, respectively, the first and second chiplet dies being interfaced with one another via a die-to-die interface to enable the first and second chiplet dies to communicate with one another;

with a fault monitoring system, monitoring at least the first chiplet die for faults and assigning a first value to a selector signal if the fault monitoring system detects a fault in the first chiplet die; and with a selector circuit that receives the selector signal and the first and second output signals, outputting the second output signal from the automotive fault detection and recovery system to an automotive control unit input signal path if the selector signal has been assigned the first value.

18. The method of claim 17, further comprising:

with the fault monitoring system, monitoring at least the second chiplet die for faults and assigning a second value to the selector signal if the fault monitoring system detects a fault in the second chiplet die; and with the selector circuit, outputting the first output signal from the automotive fault detection and recovery system if the selector signal has been assigned the second value.

19. The method of claim 17, wherein the first and second chiplet dies further comprise at least first and second instances, respectively, of a second ASIL domain circuit configured to perform at least a second ASIL domain process on one or more ASIL input signals to produce third and fourth output signals, respectively.

20. The method of claim 19, wherein the first and second instances of the first ASIL domain circuit are first and second instances, respectively, of an up-to-ASIL D domain circuit, the first ASIL domain process comprising at least an up-to-ASIL D domain process, and wherein the first and second instances of the second ASIL domain circuit are first and second instances, respectively, of an up-to-ASIL B domain circuit, the second ASIL domain process comprising at least an up-to-ASIL B domain process.

21. The method of claim 20, further comprising:

in the first instance of the up-to-ASIL D domain circuit, performing decomposition by:

comparing the third and fourth output signals to one another to produce a comparison result;

processing the comparison result to determine whether or not a correctness of the comparison result can be verified; and if the first instance of the up-to-ASIL D domain circuit verifies the correctness of the comparison result, outputting one of the third and fourth output signals as the first output signal or as a component of the first output signal.

22. The method of claim 20, further comprising:

in the first instance of the first up-to-ASIL D domain circuit, processing the third output signal produced by the first instance of the up-to-ASIL B domain circuit to verify a validity of the third output signal.

23. The method of claim 22, further comprising:

in the second instance of the up-to-ASIL D domain circuit, processing the fourth output signal produced by the second instance of the up-to-ASIL B domain circuit to verify a validity of the fourth output signal.

24. The method of claim 19, wherein the fault monitoring system comprises a first fault monitoring circuit disposed in the first chiplet die, the method further comprising:

with the first fault monitoring circuit, detecting faults in the first instance of the first ASIL domain circuit and assigning the first value to the selector signal if a fault in the first instance of the first ASIL domain circuit is detected by the first fault monitoring circuit.

25. The method of claim 24, wherein the fault monitoring system further comprises a second fault monitoring circuit disposed in the second chiplet die, the method further comprising:

with the second fault monitoring circuit, detecting faults in the second instance of the first ASIL domain circuit and forwarding faults detected in the second instance of the first ASIL domain circuit to the first fault monitoring circuit.

26. The method of claim 25, further comprising:

with the first fault monitoring circuit, forwarding faults detected in the first instance of the first ASIL domain circuit to the second fault monitoring circuit.

27. The method of claim 24, wherein the fault monitoring system further comprises a third fault monitoring circuit disposed in the first chiplet die and in communication with the first fault monitoring circuit, the method further comprising:

with the third fault monitoring circuit, detecting faults in the first instance of the second ASIL domain circuit and informing the first fault monitoring circuit if a fault is detected by the third fault monitoring circuit; and with a fourth fault monitoring circuit disposed in the second chiplet die and in communication with the second fault monitoring circuit, detecting faults in the second instance of the second ASIL domain circuit and informing the second fault monitoring circuit if a fault is detected by the fourth fault monitoring circuit.

28. The method of claim 25, further comprising an external fault monitoring system in communication with the first and second chiplet dies, the method further comprising:

between the first and second fault monitoring circuits, transmitting a bidirectional heartbeat signal;

in the first and second fault monitoring circuits, determining whether there has been a failure to detect the bidirectional heartbeat signal, and if so, notifying the external fault detection system of the failure to detect the bidirectional heartbeat signal; and with the external monitoring system, upon being notified of the failure, assigning the first value to the selector signal if the second fault monitoring circuit failed to detect the bidirectional heartbeat signal and assigning the second value to the selector signal if the first fault monitoring circuit failed to detect the bidirectional heartbeat signal.

29. A non-transitory computer-readable medium comprising computer instructions for execution by at least first and second chiplet dies disposed in a system-on-a-chip (SoC) integrated circuit (IC) package of an automotive fault detection and recovery system, the first and second chiplet dies being in communication with one another via a die-to-die interface, the computer instructions comprising:

first and second sets of computer instructions for execution by the first and second chiplet dies, respectively, to perform a first automotive safety integrity level (ASIL) domain process on one or more ASIL input signals to produce first and second output signals, respectively, that are outputted from the first and second chiplet dies, respectively;

a third set of computer instructions for causing a selector circuit to select one of the first and second output signals to be outputted from the automotive fault detection and recovery system to an automotive control unit input signal path based on a value of a selector signal received by the selector circuit; and a fourth set of computer instructions for monitoring the first and second chiplet dies for faults and for assigning a first value to the selector signal if the fault monitoring system detects a fault in the first chiplet die, wherein assignment of the first value to the selector signal causes the second output signal to be outputted from the automotive fault detection and recovery system by the selector circuit.

30. An automotive fault detection and recovery system comprising:

at least first and second chiplet dies disposed in a system-on-a-chip (SoC) integrated circuit (IC) package and being in communication with one another via a die-to-die interface, the first and second chiplet dies comprising at least a first and second means for performing at least a first ASIL domain process on one or more ASIL input signals to produce first and second output signals, respectively;

means for selecting one of the first and second output signals to be outputted from the automotive fault detection and recovery system to an automotive control unit input signal path based on a value of a selector signal received by the means for selecting; and means for monitoring the first and second chiplet dies and for assigning a first value to the selector signal if the means for monitoring detects a fault in the first chiplet die, wherein assignment of the first value to the selector signal causes the second output signal to be outputted from the automotive fault detection and recovery system.

* * * * *